United States Patent
Shimomura

(10) Patent No.: US 9,343,129 B2
(45) Date of Patent: May 17, 2016

(54) MAGNETIC MEMORY

(71) Applicant: Naoharu Shimomura, Tokyo (JP)

(72) Inventor: Naoharu Shimomura, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 299 days.

(21) Appl. No.: 13/719,896

(22) Filed: Dec. 19, 2012

(65) Prior Publication Data
US 2013/0250666 A1  Sep. 26, 2013

(30) Foreign Application Priority Data
Mar. 23, 2012 (JP) .................................. 2012-067899

(51) Int. Cl.
 G11C 11/00 (2006.01)
 G11C 11/16 (2006.01)
 G11C 11/02 (2006.01)
(52) U.S. Cl.
 CPC ................. *G11C 11/16* (2013.01); *G11C 11/02* (2013.01); *G11C 11/161* (2013.01)
(58) Field of Classification Search
None
See application file for complete search history.

(56) References Cited

U.S. PATENT DOCUMENTS

| 6,611,455 B2 | 8/2003 | Sekiguchi et al. |
| 7,787,288 B2 | 8/2010 | Kitagawa et al. |
| 8,154,913 B2 | 4/2012 | Fukami et al. |
| 2009/0290268 A1* | 11/2009 | Xi et al. ................... 360/324.12 |
| 2012/0314489 A1* | 12/2012 | Lilja et al. .................... 365/158 |

FOREIGN PATENT DOCUMENTS

| JP | 2003-86777 | 3/2003 |
| JP | 2008-171862 A | 7/2008 |
| JP | 4250644 | 1/2009 |

OTHER PUBLICATIONS

Japanese Office Action issued Nov. 1, 2013 in Patent Application No. 2012-067899 with English Translation.
U.S. Appl. No. 13/424,769, filed Mar. 20, 2012, Eiji Kitagawa, et al.

* cited by examiner

*Primary Examiner* — Kretelia Graham
(74) *Attorney, Agent, or Firm* — Oblon, McClelland, Maier & Neustadt, L.L.P

(57) ABSTRACT

A magnetic memory according to an embodiment includes: a first MTJ element including a first storage layer including a first magnetic film having a changeable magnetization direction, a first reference layer including a second magnetic film having a fixed magnetization direction, and a first tunnel barrier layer provided therebetween; and a second MTJ element including a second storage layer including a third magnetic film having a changeable magnetization direction and magnetically connected to the first storage layer, a second reference layer including a fourth magnetic film having a fixed magnetization direction parallel to the magnetization direction of the first reference layer, and a second tunnel barrier layer provided therebetween, the second MTJ element being arranged in parallel with the first MTJ element in a direction perpendicular to a stacking direction of the first MTJ element.

19 Claims, 16 Drawing Sheets

1

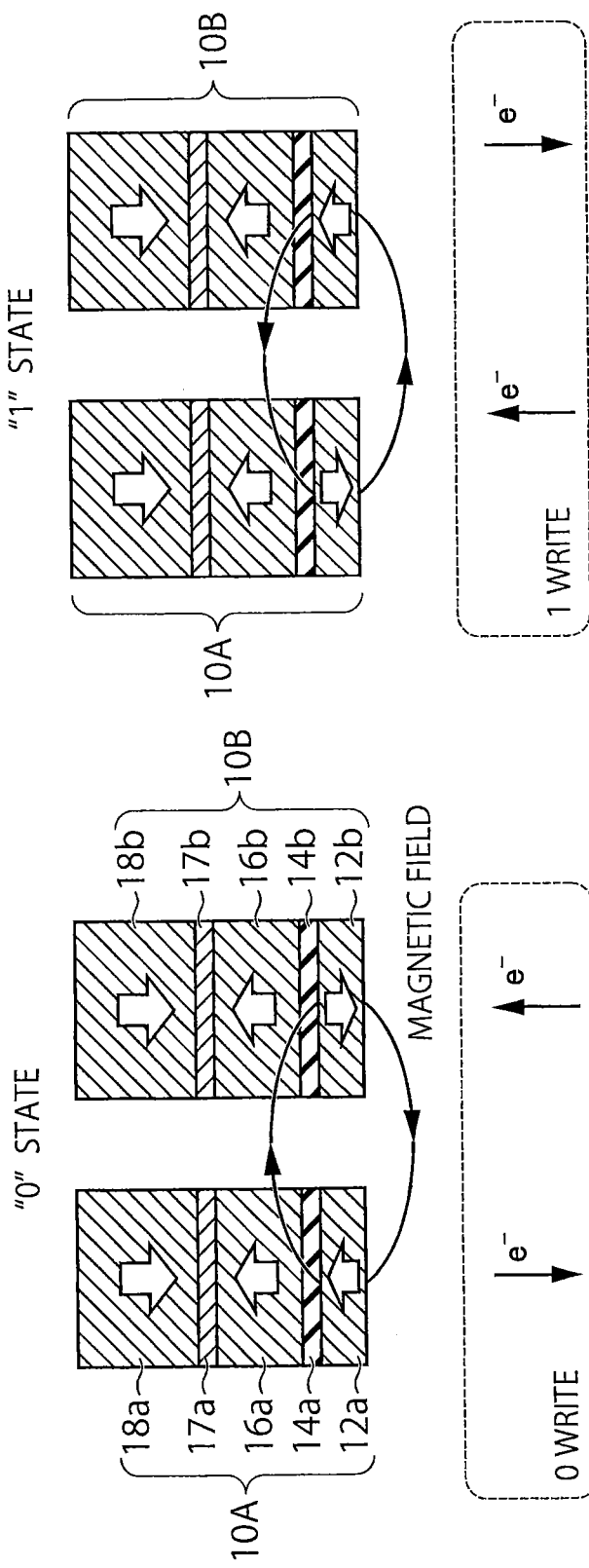

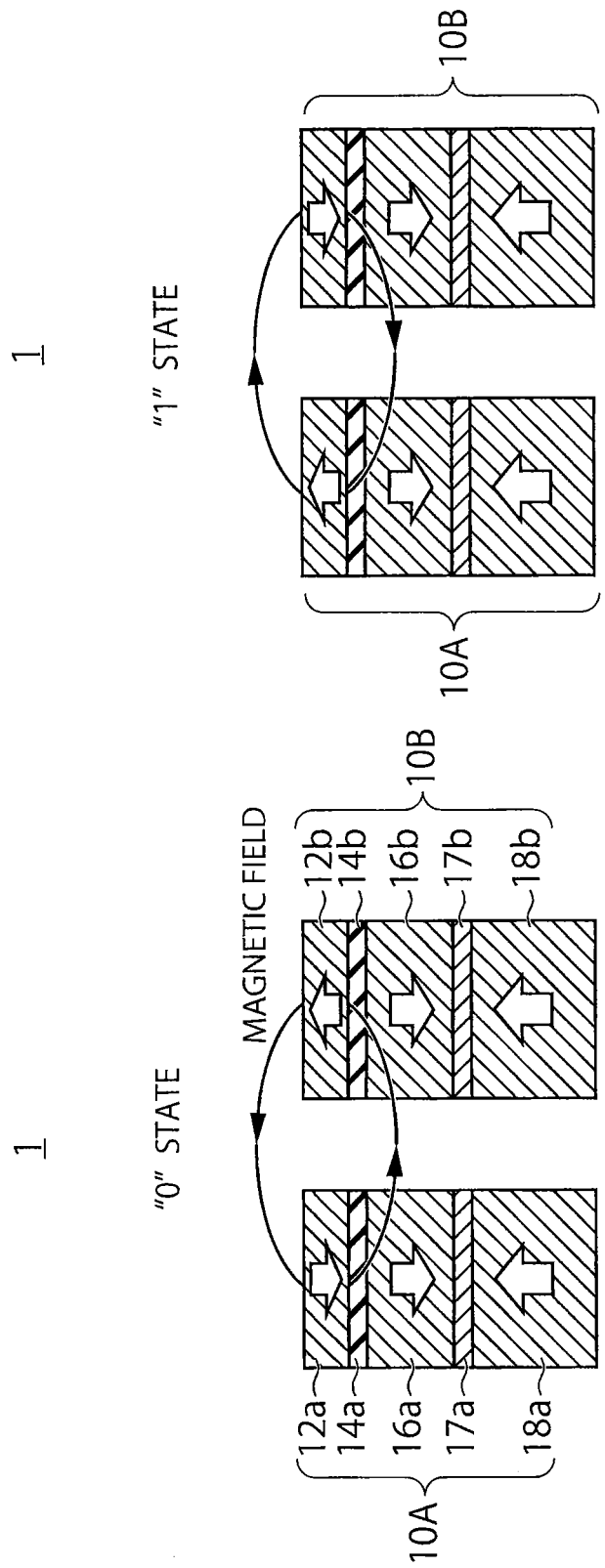

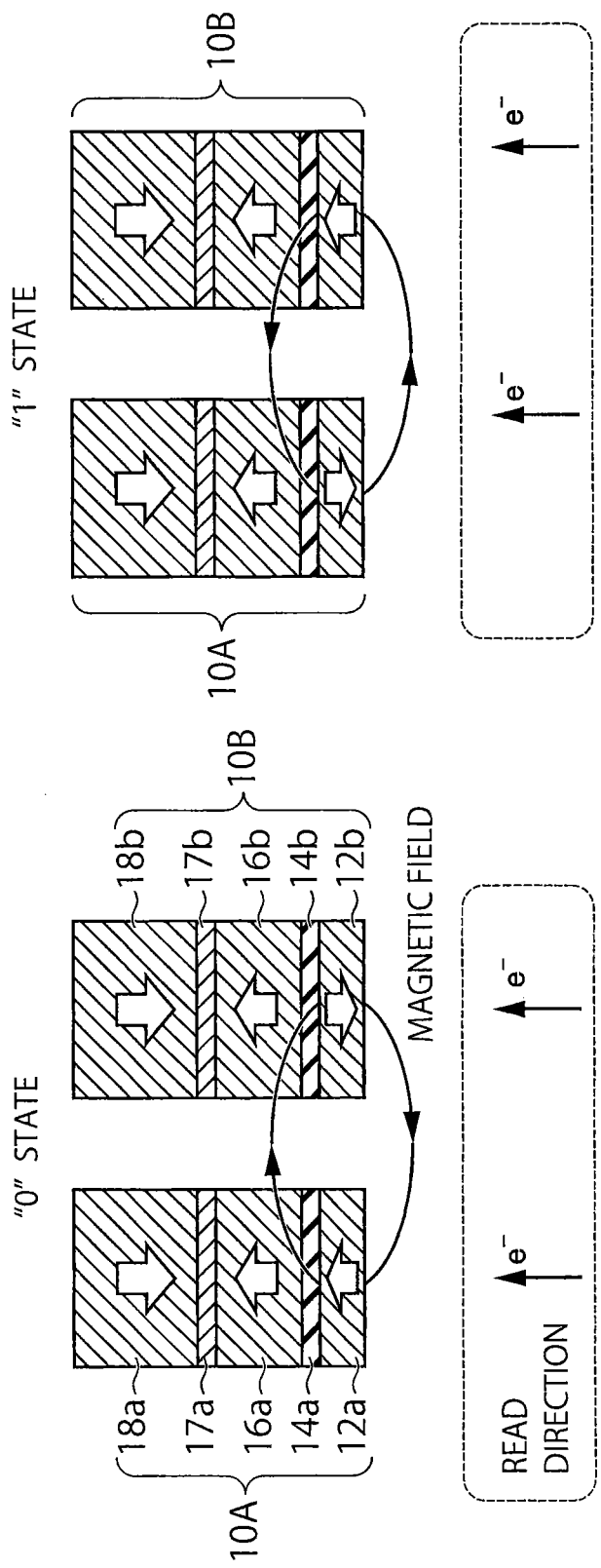

MAGNETIC MEMORY

CROSS-REFERENCE TO RELATED APPLICATION

This application is based upon and claims the benefit of priority from prior Japanese Patent Application No. 2012-67899 filed on Mar. 23, 2012 in Japan, the entire contents of which are incorporated herein by reference.

FIELD

Embodiments described herein relate generally to magnetic memories.

BACKGROUND

MRAMs (Magnetoresistive Random Access Memories) are memories using magnetization reversals. Spin-injection MRAMs using spin torque transfer switching writing excel in speed, integration properties, and durability, and are expected as general-purpose nonvolatile random access memories.

MTJ (Magnetic Tunnel Junction) elements are used as storage elements of spin-injection MRAMs. An MTJ element has a three-layer structure that includes: a storage layer including a magnetic layer having a magnetization direction that is switched by a memory write operation; a reference layer including a magnetic layer having a magnetization direction that is fixed in one direction; and a tunnel barrier layer that is interposed between the storage layer and the reference layer, and forms a tunnel barrier. Depending on whether the magnetization directions of the storage layer and the reference layer are parallel or antiparallel, the electrical resistance becomes a low resistance or a high resistance when a current is applied in a direction perpendicular to the film plane of the MTJ element. By using the resistance difference between the parallel state and the antiparallel state, data can be read from the MTJ element serving as a storage element.

Spin torque transfer switching writing is performed by adjusting the magnetization direction of the storage layer through flowing current in the direction perpendicular to the film plane of the MTJ element. To switch the magnetization from the antiparallel state to the parallel state, a current is applied in such a direction that electrons flow from the reference layer toward the storage layer. The current direction is the direction from the storage layer toward the reference layer. Through flowing the current, a spin torque to reverse a magnetization direction to a direction parallel to the magnetization direction of the reference layer is applied to the magnetization of the storage layer. By flowing a current equal to or higher than a threshold value, the magnetization of the storage layer can be changed. To switch the magnetization from the parallel state to the antiparallel state, a current is flowed in such a direction that electrons flow from the storage layer toward the reference layer. A spin torque acts on the magnetization of the storage layer, so that the magnetization is switched to the direction antiparallel to the magnetization direction of the reference layer. Data can be rewritten by changing current flow directions in the above manner.

There have been MTJ elements using perpendicular magnetization films each having a magnetization direction perpendicular to the film plane, and MTJ elements using in-plane magnetization films each having a magnetization direction parallel to the film plane. In an MTJ element using perpendicular magnetization films, the magnetic field straying from the reference layer acts on the storage layer, and therefore, the magnetic field needs to be cancelled. According to a suggested method to do so, a shifting magnetic-field correction layer is placed on the opposite side of the reference layer from the tunnel barrier layer. The magnetization direction of the shifting magnetic-field correction layer is antiparallel to the magnetization direction of the reference layer, and is adjusted so as to cancel the magnetic field acting on the storage layer.

In a variable-resistance memory using spin torque transfer switching writing, currents are applied to an MTJ element through the same path at the time of writing and at the time of reading. Therefore, there is a potential risk of "read disturb", which is a phenomenon of data being rewritten at the time of reading. To avoid the risk, the read current to be applied to an MTJ at the time of reading is made smaller than the write current according to a method. By this technique, the read disturb probability is lowered. However, reducing the read current leads to a decrease in read sensitivity, and therefore, there is a limit to the reduction of practical read current.

By another suggested method to avoid read disturb, the read disturb probability is lowered by making the read current pulse width smaller than the write current pulse width. The read disturb probability can also be lowered by this method. However, in a memory required to perform high-speed operations, the write pulse width is made smaller in response to demand for high-speed writing. Therefore, read pulses need to be made even shorter. However, there is also a limit to the reduction of read pulse width, to avoid the problems with read sensitivity and pulse wiring delay.

BRIEF DESCRIPTION OF THE DRAWINGS

FIGS. 1A and 1B are diagrams for explaining a write method implemented in a magnetic memory according to a first embodiment;

FIGS. 1C and 1D are schematic views showing that a memory cell is in an information "0" state and is in an information "1" state, respectively, in the magnetic memory according to a modification of the first embodiment;

FIGS. 2A and 2B are diagrams for explaining a read method implemented in the magnetic memory according to the first embodiment;

DETAILED DESCRIPTION

Figure 3A:
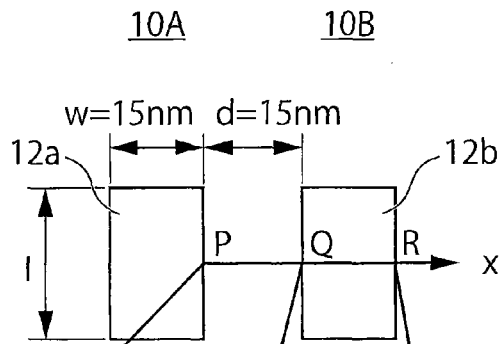
FIGS. 3A and 3B are diagrams for explaining interactions between the MTJ elements forming a pair in a memory cell.

A magnetic memory according to an embodiment includes: a memory cell, the memory cell comprising: a first MTJ element including a first storage layer including a first magnetic film having a changeable magnetization direction, a first reference layer including a second magnetic film having a fixed magnetization direction, and a first tunnel barrier layer provided between the first storage layer and the first reference layer; and a second MTJ element including a second storage layer including a third magnetic film having a changeable magnetization direction and magnetically connected to the first storage layer, a second reference layer including a fourth magnetic film having a fixed magnetization direction parallel to the magnetization direction of the first reference layer, and a second tunnel barrier layer provided between the second storage layer and the second reference layer, the second MTJ element being arranged in parallel with the first MTJ element in a direction perpendicular to a stacking direction of the first MTJ element.

Embodiments will now be explained with reference to the accompanying drawings.

First Embodiment

Referring to FIGS. 1A through 8, a magnetic memory according to a first embodiment is described. The magnetic memory of the first embodiment includes at least one memory cell, and this memory cell is shown in FIGS. 1A and 1B. FIGS. 1A and 1B are schematic views showing that the memory cell 1 is in an information "0" state and is in an information "1" state, respectively. This memory cell 1 includes two MTJ elements 10A and 10B that are arranged in parallel and magnetically interact with each other. The MTJ element 10A has a structure in which a storage layer 12a, a tunnel barrier layer 14a, a reference layer 16a, a nonmagnetic layer 17a, and a shifting magnetic-field adjustment layer 18a are stacked in this order. The MTJ element 10B has a structure in which a storage layer 12b, a tunnel barrier layer 14b, a reference layer 16b, a nonmagnetic layer 17b, and a shifting magnetic-field adjustment layer 18b are stacked in this order. The above described stacking order in the MTJ element 10A and the MTJ element 10B can be reversed, as shown in FIGS. 1C and 1D. Still, the MTJ element 10A and the MTJ element 10B have the same stacked structures. In a case where the storage layer 12a is the lowermost layer while the shifting magnetic-field adjustment layer 18a is the uppermost layer in the MTJ element 10A, for example, the storage layer 12b is the lowermost layer while the shifting magnetic-field adjustment layer 18b is the uppermost layer in the MTJ element 10B.

The storage layers 12a and 12b each have magnetization perpendicular to the film plane, and the magnetization direction is changeable. The reference layers 16a and 16b each have magnetization perpendicular to the film plane, and the magnetization direction is fixed. Here, the "film plane" means the plane perpendicular to the stacking direction of the element. That is, the film plane of the storage layer 12a means the plane perpendicular to the stacking direction of the storage layer 12a, or the upper surface of the storage layer 12a, for example. Where magnetization is changeable, the magnetization direction changes when a write current is applied to the MTJ element. Where magnetization is fixed, the magnetization direction does not change when a write current is applied to the MTJ element. In FIGS. 1A and 1B, each of the storage layers 12a and 12b is a single layer, but can be a stacked structure having a nonmagnetic layer interposed between ferromagnetic layers. In that case, all the ferromagnetic layers forming the storage layers 12a and 12b have changeable magnetization directions that change at the same time. In FIGS. 1A and 1B, each of the reference layers 16a and 16b is a single layer, but can be a stacked structure having a nonmagnetic layer interposed between ferromagnetic layers. In that case, each two adjacent ferromagnetic layers are ferromagnetically or antiferromagnetically bonded to each other.

The shifting magnetic-field adjustment layers 18a and 18b each have magnetization perpendicular to the film plane, and the magnetization direction is fixed. The magnetization direction of the shifting magnetic-field adjustment layer 18a is the opposite of (antiparallel to) the magnetization direction of the reference layer 16a, and is adjusted so as to cancel the magnetic field acting on the storage layer 12a. The magnetization direction of the shifting magnetic-field adjustment layer 18b is the opposite of (antiparallel to) the magnetization direction of the reference layer 16b, and is adjusted so as to cancel the magnetic field acting on the storage layer 12b.

In this embodiment, the magnetization directions of the reference layers 16a and 16b of the memory cell 1 are the same (parallel), and are upward directions, as shown in FIGS. 1A and 1B. Accordingly, the magnetization directions of the shifting magnetic-field adjustment layers 18a and 18b are downward directions. Also, as shown in FIGS. 1A and 1B, the storage layers 12a and 12b are designed to have magnetization in the opposite directions from each other.

In this embodiment, the two MTJ elements 10A and 10B in the memory cell 1 magnetically interact with each other, and the pair of MTJ elements 10A and 10B form a 1-bit memory cell. In the pair of MTJ elements 10A and 10B, magnetic fields straying from the storage layers 12a and 12b act on the storage layers 12b and 12a on each other side. Magnetic fields straying from the reference layer 16a and the shifting magnetic-field adjustment layer 18a of the MTJ element 10A, which is one MTJ element of the pair of MTJ elements 10A and 10B, also act on the storage layer 12b of the MTJ element 10B of the pair. Therefore, the magnetic field acting on the storage layer 12b of the MTJ element 10B is designed to cancel not only the magnetic fields generated from the reference layer 16b and the shifting magnetic-field adjustment layer 18b of the MTJ element 10B, but also the combination of the magnetic fields of the reference layer 16a and the shifting magnetic-field adjustment layer 18a of the MTJ element 10A of the pair. Also, the magnetic field acting on the storage layer 12a of the MTJ element 10A is designed to cancel not only the magnetic fields generated from the reference layer 16a and the shifting magnetic-field adjustment layer 18a of the MTJ element 10A, but also the combination of the magnetic fields generated from the reference layer 16b and the shifting magnetic-field adjustment layer 18b of the MTJ element 10B of the pair. For ease of explanation, in FIGS. 1A and 1B, only the magnetic fields generated from the storage layers 12a and 12b of the pair of MTJ elements 10A and 10B are shown, but the magnetic fields that are generated from the reference layers and the shifting magnetic-field adjustment layers and have magnetization directions not changed by write operations are not shown.

As shown in FIGS. 1A and 1B, the magnetization directions of the storage layers 12a and 12b of the pair of MTJ elements 10A and 10B are the opposite of each other. With this arrangement, the magnetic fields generated from the storage layers form a loop, and act in such directions that the storage layers stabilize each other's magnetization state, and magnetization reversals are not easily caused by a disturbance magnetic field or thermal disturbance from outside.

To cause the MTJ elements 10A and 10B to function as a memory, the state where the magnetization of the storage layer 12a of the MTJ element 10A is in an upward direction while the magnetization of the storage layer 12b of the MTJ element 10B is in a downward direction is set as the "0" state, and the state where the magnetization of the storage layer 12a of the MTJ element 10A is in a downward direction while the magnetization of the storage layer 12b of the MTJ element 10B is in an upward direction is set as the "1" state, for example, as shown in FIGS. 1A and 1B. In the case where the magnetization of each reference layer is in an upward direction as shown in FIGS. 1A and 1B, in the "0" state, the MTJ element 10A is in a low-resistance state, and the MTJ element 10B is in a high-resistance state. In the "1" state, on the other hand, the MTJ element 10B is in a low-resistance state, and the MTJ element 10A is in a high-resistance state. The settings of the "0" state and the "1" state can be reversed.

The storage layers 12a and 12b and the reference layers 16a and 16b of the MTJ elements 10A and 10B shown in FIGS. 1A and 1B are made of a ferromagnetic material. This ferromagnetic material can be Co, Fe, Ni, or an alloy containing any of those elements, for example. The storage layers 12a and 12b and the reference layers 16a and 16b can each have a structure in which a layer formed with an alloy or artificial lattice film or the like having a high perpendicular magnetic anisotropy, and a layer made of CoFe or CoFeB or the like having a high spin polarizability are stacked. The reference layers 16a and 16b are designed to have perpendicular magnetic anisotropy energy sufficiently higher than that of the storage layers 12a and 12b. A magnetic anisotropy can be set by adjusting the material composition or film thickness.

Each of the tunnel barrier layers 14a and 14b can be formed with an insulating oxide film such as a MgO film or an $Al_2O_3$ film. The thickness of the insulating oxide film is adjusted to about 1 nm or smaller so that the resistance generated by a tunneling current can be several tens of $\Omega\mu m^2$ or lower, or several $\Omega\mu m^2$. To efficiently perform spin injection, the size of each MTJ element is preferably 100 nm or less in diameter, or more preferably, 40 nm or less in diameter.

(Write Method)

Next, a method to perform writing on the memory cell 1, or the pair of MTJ elements 10A and 10B, is described. When writing is performed on the MTJ elements 10A and 10B, current pulses acting in the opposite directions from each other are applied to the pair of MTJ elements 10A and 10B. In FIGS. 1A and 1B, the magnetization of each of the reference layers 16a and 16b is in an upward direction, and the storage layers 12a and 12b are located below the reference layers 16a and 16b. In this example, to write the information "0", currents are applied in such directions that electrons flow downward in the MTJ element 10A and flow upward in the MTJ element 10B, as illustrated in FIG. 1A. Here, each arrow shown next to "e⁻" indicates an electron flowing direction. The current direction is the opposite of the direction indicated by the arrow. By this current, an upward spin torque is applied to the magnetization of the storage layer 12a in the MTJ element 10A, and a downward spin torque is applied in the MTJ element 10B.

To write the information "1", currents are applied in such directions that electrons flow upward in the MTJ element 10A and flow downward in the MTJ element 10B, as illustrated in FIG. 1B. Accordingly, a downward spin torque is applied in the MTJ element 10A, and an upward spin torque is applied in the MTJ element 10B.

In the above description, the magnetization directions of the reference layers 16a and 16b are parallel to each other. However, the magnetization directions of the reference layers 16a and 16b can be antiparallel to each other. In that case, the write currents can be applied in the same direction. Reading can be performed by flowing currents in the same direction or in the opposite directions. However, to minimize read disturb, it is preferable to perform reading by flowing the currents in the opposite directions.

As described above, the magnetic fields generated from the storage layers 12a and 12b of the pair of MTJ elements 10A and 10B act to stabilize the magnetization state in each other element. However, at the time of writing, magnetization reversals occur simultaneously in the two MTJ elements 10A and 10B. Accordingly, the magnetic fields generated from the storage layers 12a and 12b hardly hinder the magnetization reversal in each other element. A spin torque transfer switching occurs when spin precession is amplified. However, oscillations of magnetic fields generated at the time of spin precession resonate with each other MTJ element, and facilitate spin precession amplification and spin torque transfer switching. Accordingly, the increase in the write current caused by the magnetic fields acting on each other is small enough.

(Read Method)

Referring now to FIGS. 2A and 2B, a method of reading from the two MTJ elements 10A and 10B of the memory cell 1 is described. At the time of reading, read currents are flowed to the two MTJ elements 10A and 10B in the same direction. The read currents have smaller values than the write currents. FIGS. 2A and 2B illustrate an example case where the currents are flowed in such directions that electrons flow upward in both of the two MTJ elements 10A and 10B at the time of reading. FIG. 2A is a diagram for explaining the reading in the "0" state. By the read currents, a spin torque acting in such a direction as to switch magnetization to a downward direction is applied to the magnetization of each of the storage layers 12a and 12b of the MTJ elements 10A and 10B in this example. Since the magnetization of the storage layer 12b of the MTJ element 10B is originally in a downward direction, the spin torque generated by the read current acts in such a direction as to stabilize the magnetization direction.

On the other hand, the magnetization of the storage layer 12a of the MTJ element 10A is in an upward direction, and therefore, a spin torque in the opposite direction from the magnetization direction is applied to the storage layer 12a by the read current. However, an upward magnetic field is applied to the MTJ element 10A from the MTJ element 10B. Accordingly, magnetization reversals (read disturb) due to the read current can be avoided. FIG. 2B is a diagram for explaining the reading in the "1" state. In this case, a spin torque in the opposite direction from the magnetization direction is applied to the MTJ element 10B, and a spin torque in such a direction as to stabilize the magnetization direction is applied to the MTJ element 10A. By virtue of the magnetic field from the storage layer 12a of the MTJ element 10A, the MTJ element 10B can avoid a magnetization reversal due to the spin torque generated by the current at the time of reading.

By another read method, currents are flowed in such directions that electrons flow downward in each of the two MTJ elements 10A and 10B, which is the opposite of the example illustrated in FIGS. 2A and 2B. In this case, a spin torque in the opposite direction from the magnetization direction is applied to one of the MTJ elements by the read current, but a magnetization reversal is avoided by virtue of the magnetic field straying from the storage layer of the other MTJ element, as in FIGS. 2A and 2B.

Further, reading can be performed by flowing a read current to only one of the MTJ elements 10A and 10B. In this case, even if a spin torque in the opposite direction from the magnetization direction acts on the MTJ element having the read current applied thereto, magnetization reversals can be prevented by the magnetic field straying from the other one of the two MTJ elements.

Figure 3B:
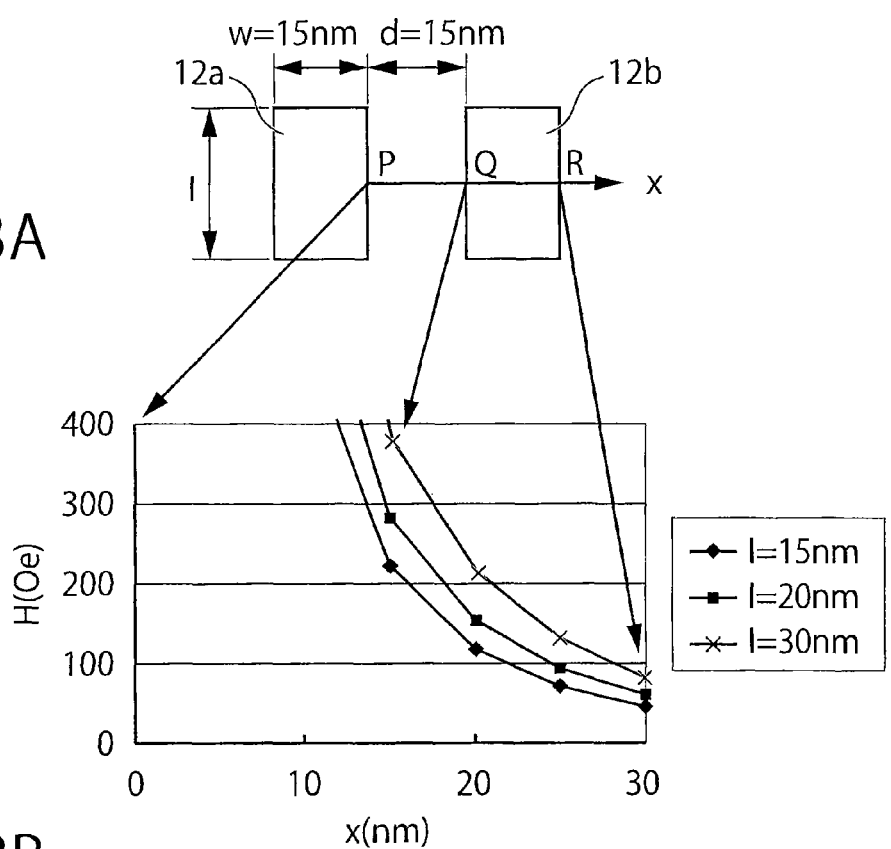

FIGS. 3A and 3B show examples of interactive magnetic field intensities between the two MTJ elements. FIG. 3A is a diagram of the storage layers 12a and 12b of the MTJ elements 10A and 10B, viewed from above. The width w of each of the MTJ elements 10A and 10B is 15 nm, and the distance d between the MTJ elements 10A and 10B is 15 nm. Calculations were performed where the length l of each of the MTJ elements 10A and 10B is 15 nm, 20 nm, and 30 nm. In the calculations, the saturation magnetization Ms of each of the storage layers 12a and 12b is 1400 emu/cc, and the thickness t of each of the storage layers 12a and 12b is 5 nm. The two MTJ elements 10A and 10B are arranged in the narrow side direction of the film-plane shape.

The x-axis is set in the direction from the center (point P) of a side of the MTJ element 10A toward the MTJ element 10B. FIG. 3B shows the x-axial values of the intensities of strayed magnetic fields generated by the storage layer 12a of the MTJ element 10A. In a case where the MTJ element 10A and the MTJ element 10B have the same shape, or where the width of the storage layer 12b is 15 nm, the absolute values of the intensities of magnetic fields straying from the MTJ element 10B affecting the MTJ element 10A have the same distribution. The magnetic field direction is substantially perpendicular to the film plane. As the distance d between the MTJ element 10A and the MTJ element 10B becomes shorter, the magnetic interaction becomes larger, and stronger coupling occurs. Therefore, the two MTJ elements 10A and 10B need to be placed reasonably close to each other. The magnetic interaction also becomes larger as the facing sides are made longer. However, if the area of each MTJ element is increased, the write current becomes larger. Therefore, there is a trade-off relationship between increasing the magnetic interaction by increasing the lengths of the facing sides and reducing the write current. In a case where the width w of each MTJ element is 15 nm, the length l of each MTJ element is 30 nm, and the distance d between the MTJ element 10A and the MTJ element 10B is 15 nm, for example, the magnetic field straying from the storage layer 12a of the MTJ element 10A is approximately 380 Oe at point Q, and is 90 Oe at point R, as shown in FIG. 3B. On average, a magnetic field of approximately 200 Oe is applied. If the coercive force of the storage layers 12a and 12b is 1000 Oe when the MTJ element 10A and the MTJ element 10B exist independently of each other, the data retention energy increases approximately $(1000+200)^2/1000^2$ to 1.4 times, as the two MTJ elements 10A and 10B magnetically interact with each other.

Figure 4B:
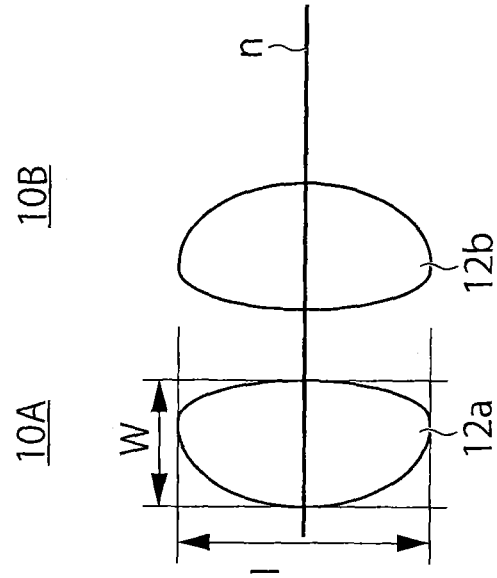
FIGS. 4A and 4B are diagrams each showing the shapes of the MTJ elements forming a pair in a memory cell.
Figure 4A:
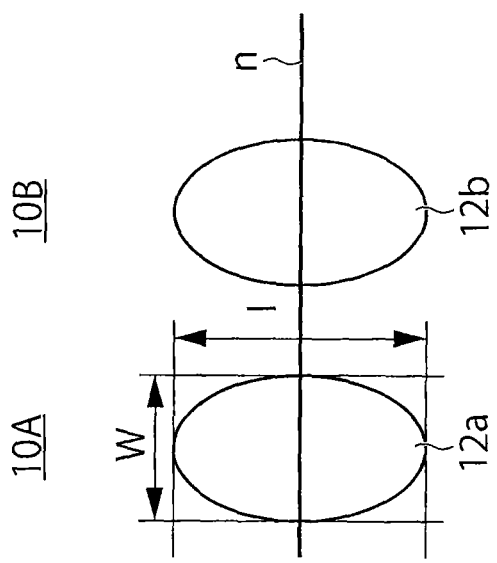

The shapes of the MTJ elements 10A and 10B are not limited to the rectangles shown in FIG. 3A, but can be elliptical shapes as shown in FIG. 4A or shapes each having different curvature radii on the left sides (second side 21, third side 22) and right sides (first side 20, fourth side 23), respectively, as shown in FIG. 4B. In a case where the straight line passing through the gravity centers of the pair of MTJ elements 10A and 10B is a straight line n, the efficiency of the interactive magnetic fields becomes higher when the maximum value l of the external size of each of the MTJ element 10A and 10B in the direction perpendicular to the straight line n is larger than the maximum value w of the external size in the direction parallel to the straight line n (see FIG. 3B). The efficiency becomes even higher when the curvature radius of the sidewall closer to each other one of the two MTJ elements 10A and 10B (first side 20, third side 22) is larger than the curvature radius of the side farther from each other MTJ element (second side 21, fourth side 23), as shown in FIG. 4B. This is supposedly because the proportion of the region closer to each other MTJ element is higher in the case illustrated in FIG. 4B than in the case illustrated in FIG. 4A.

Figure 5:
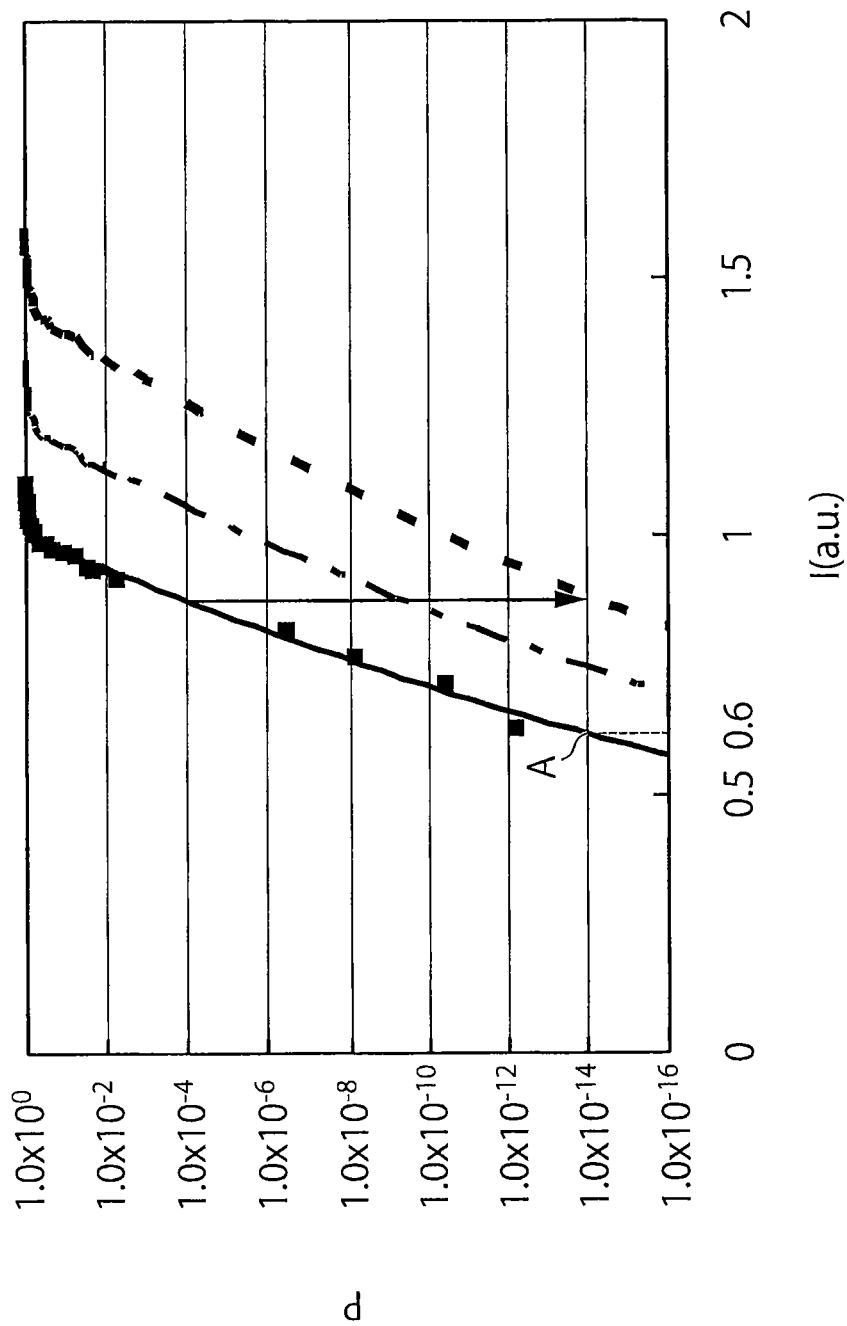
FIG. 5 is a graph showing the results of measurement carried out to measure spin torque transfer switching magnetization probabilities.

FIG. 5 shows example results of measurement carried out to measure the current dependencies of spin torque transfer switching probabilities P, using a single MTJ element including perpendicular magnetization films. The pulse width of the current pulse used in the measurement is 5 ns. The abscissa axis indicates current, and the ordinate axis indicates spin torque transfer switching probability P on a logarithmic scale. Each current value I on the abscissa axis is a value normalized with a current value (Ic) having a spin torque transfer switching probability of ½. The solid line indicates the values obtained by actually measuring a single MTJ element without an interactive magnetic field. As the current becomes lower, the spin torque transfer switching probability P exponentially decreases. If the maximum allowable read disturb probability is $1 \times 10^{-14}$, the read current needs to be 0.6 Ic or smaller, as indicated by A.

In a case where the interactive magnetic field generated from the other MTJ element of the pair changes approximately 20% of Ic, the data retention energy increases 1.4 times as described above, and Ic also increases 1.4 times. In this case, the spin torque transfer switching probability P depending on the read current is represented by the dotted line in FIG. 5. Therefore, when reading is performed with a current that is 80% of Ic, the read disturb probability becomes approximately ten digits lower, from the order of $10^{-4}$ to the order of $10^{-14}$, as indicated by the arrow in FIG. 5. In a case where the intensity of the interactive magnetic field is approximately 10% of the coercive force of the storage layer, the spin torque transfer switching probability P is represented by the dot-and-dash line, and the read disturb probability becomes approximately five digits lower.

Figure 6:
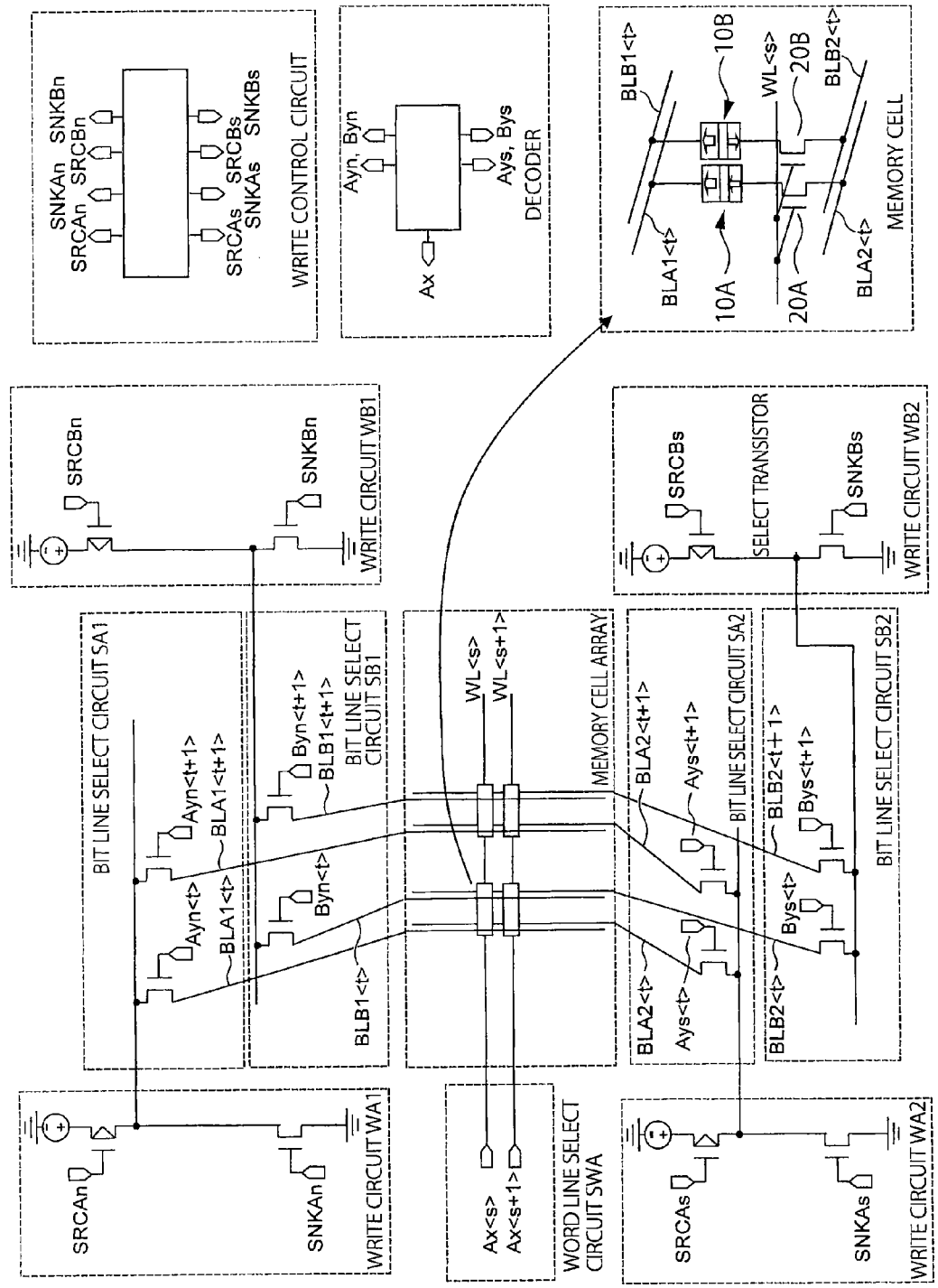
FIG. 6 is a block diagram showing the write circuit of the magnetic memory according to the first embodiment.
Figure 7:
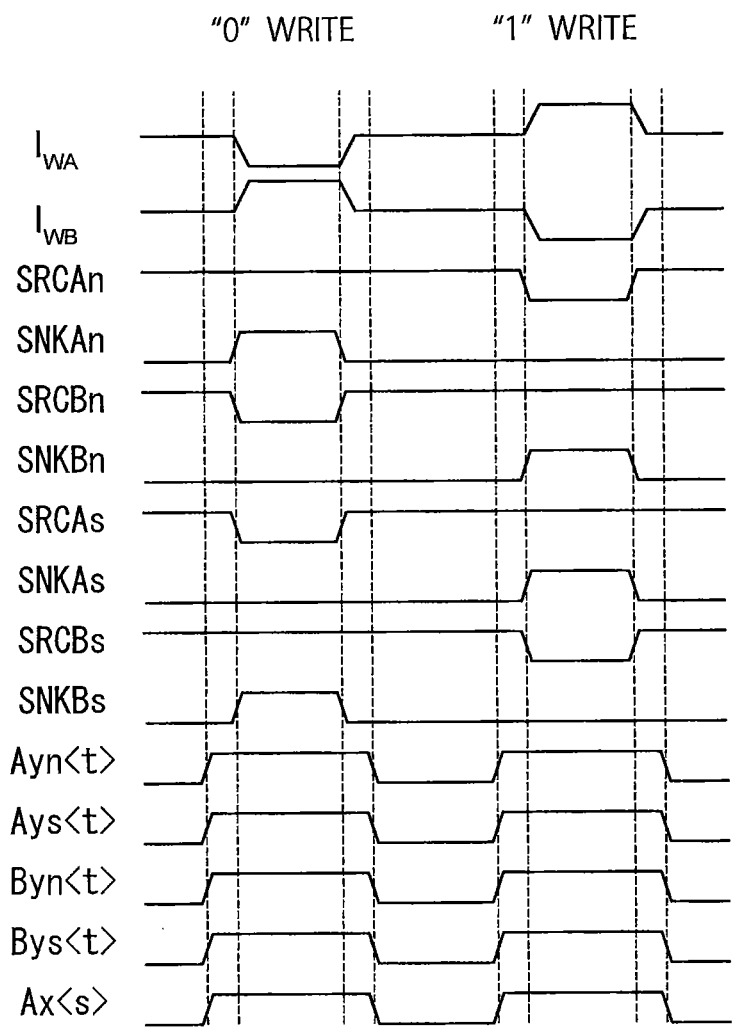
FIG. 7 shows timing charts for writing in the magnetic memory according to the first embodiment.
Figure 8:
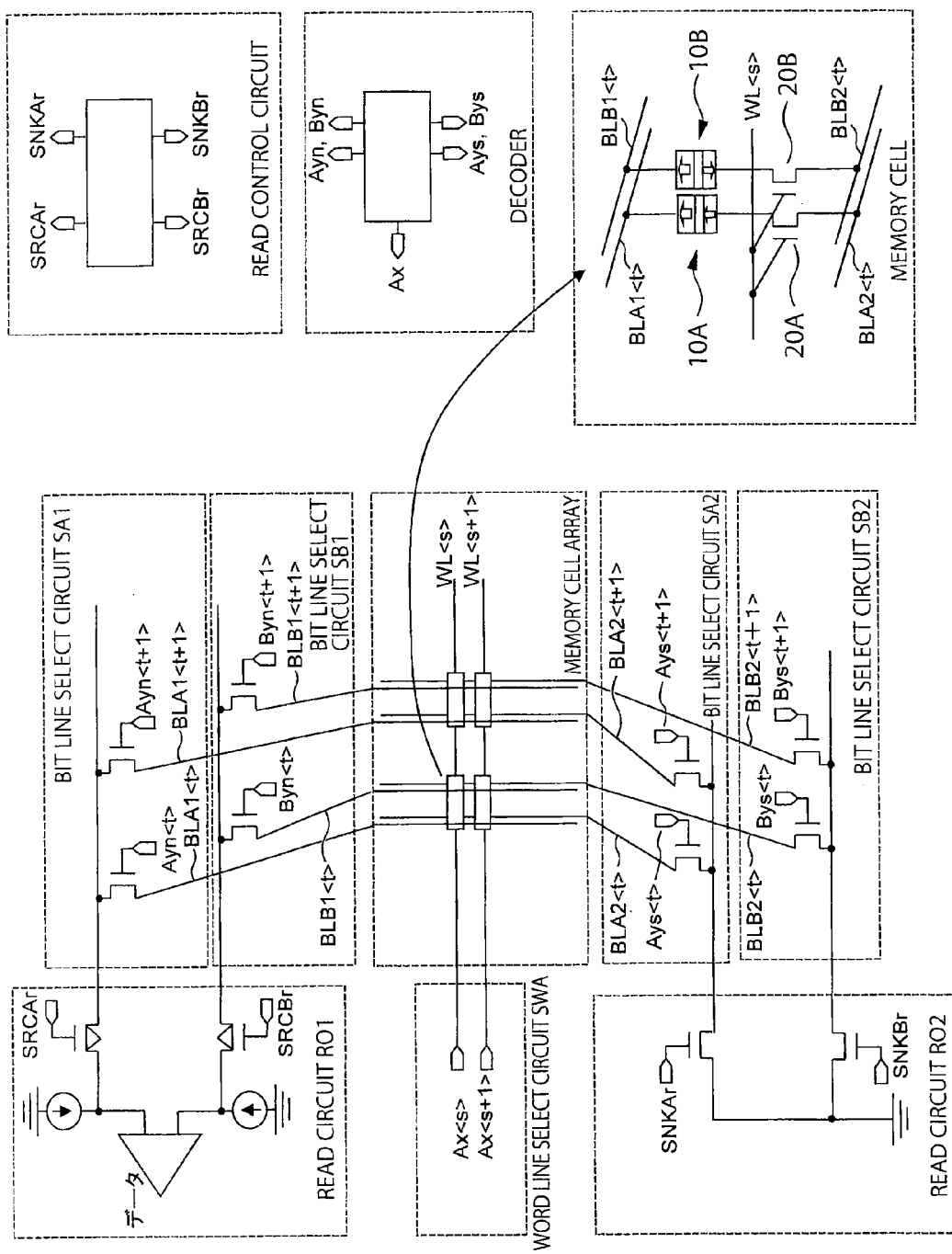
FIG. 8 is a block diagram showing the read circuit of the magnetic memory according to the first embodiment.

FIG. 6 shows an example of a write circuit to realize the magnetic memory of this embodiment. FIG. 7 shows timing charts of writing in the write circuit. FIG. 8 shows an example of a read circuit.

First, the write circuit is described. Each memory cell in the magnetic memory (MRAM) according to this embodiment includes a pair of MTJ elements 10A and 10B, and select transistors 20A and 20B electrically connected to the MTJ elements 10A and 10B, respectively. In each memory cell in a column t, the terminals of the MTJ element 10A and the MTJ element 10B on the opposite side from the terminals thereof connected to the select transistors 20A and 20B are connected to different bit lines BLA1<t> and BLB1<t>. The terminals of the two select transistors 20A and 20B on the opposite side from the terminals thereof connected to the MTJ elements 10A and 10B are connected to different bit lines BLA2<t> and BLB2<t>. Accordingly, currents can be simultaneously applied to the MTJ element 10A and the MTJ element 10B from different directions.

Meanwhile, the same word line WL<s> is connected to the gate terminals of the two select transistors 20A and 20B of the memory cell. With this arrangement, voltage is simultaneously applied to the gate terminals of the two select transistors 20A and 20B, which are then turned on. Accordingly, the MTJ element 10A and the MTJ element 10B in the memory cell are simultaneously selected.

In the memory cell array, memory cells equivalent to the four bits of a 2×2 region in the entire array are shown. The bit line BLA1<t> connected to those memory cells is connected to a write circuit WA1 via a bit line select circuit SA1, and the bit line BLA2<t> is connected to a write circuit WA2 via a bit line select circuit SA2. Likewise, the bit line BLB1<t> is connected to a write circuit WB1 via a bit line select circuit SB1, and the bit line BLB2<t> is connected to a write circuit WB2 via a bit line select circuit SB2. The word line WL<s> is also connected to a word line select circuit SWA. The magnetic memory further includes a write control circuit and a decoder.

FIG. 7 shows example timing charts of a case where the information "0" and the information "1" are written into the memory cell shown in FIG. 6. IwA schematically indicates the current to be flowed to the MTJ element 10A, and IwB schematically indicates the current to be applied to the MTJ element 10B. Here, on the ordinate axis, the positive direction (the upward direction) indicates the flowing current in the direction in which the current flows downward in FIG. 6, or electrons flow upward. In FIG. 7, the charts of SRCAn and therebelow each indicate a binary voltage signal to be applied to the gate of each corresponding transistor.

In writing the information "0", the memory cell that is located in a row s and the column t and is subjected to the writing is selected by turning on bit line select transistors Ayn<t>, Ays<t>, Byn<t>, and Bys<t> of the MTJ element 10A and the MTJ element 10B, and the common word line select transistor Ax<s> in the memory cell. After that, transistors SNKAn and SRCAs in the write circuits WA1 and WA2 are turned on, to flow the current to the MTJ element 10A in the direction from the source of the write circuit WA2 toward the sink of the write circuit WA1. Also, transistors SRCBn and SNKBs in the write circuits WB1 and WB2 are turned on, to flow the current to the MTJ element 10B in the direction from the source of the write circuit WB1 toward the sink of the write circuit WB2.

In writing the information "1", after the cell selection, transistors SRCAn, SNKAs, SNKBn, and SRCBs of the write circuits WA1, WA2, WB1, and WB2 are turned on, to apply the current to the MTJ element 10A in the direction from the source of the write circuit WA1 toward the sink of the write circuit WA2, and flow the current to the MTJ element 10B in the direction from the source of the write circuit WB2 toward the sink of the write circuit WB1. The voltages to be applied to the gate terminals of the transistors SRCAn, SRCAs, SNKAn, SNKAs, SRCBn, SRCBs, SNKBn, and SNKBs are generated from the write control circuit. The voltages to be applied to the gate terminals of the bit line select transistors Ayn<t>, Ays<t>, Byn<t>, and Bys<t>, and the word line select transistor Ax<s> are generated from the decoder.

Next, the read circuit illustrated in FIG. 8 is described. The memory cells, the memory cell array, the decoder, the bit line select circuit SA1, the bit line select circuit SA2, the bit line select circuit SB1, the bit line select circuit SB2, and the word line select circuit SWA are those shown in FIG. 6. In the read circuit illustrated in FIG. 8, the bit line BLA1<t> is connected to a read circuit RO1 via the bit line select circuit SA1. The bit line BLB1<t> is also connected to the read circuit RO1 via the bit line select circuit SB1. Meanwhile, the bit line BLA2<t> is connected to a read circuit RO2 via the bit line select circuit SA2, and the bit line BLB2<t> is connected to the read circuit RO2 via the bit line select circuit SB2. The arrows shown in the read circuit RO1 indicate the directions of current. When memory cell reading is performed by the read circuits RO1 and RO2 shown in FIG. 8, currents are flowed to the MTJ element 10A and the MTJ element 10B in such directions that the current flows downward, or electrons flow upward, as indicated in FIG. 8. The sense amplifier shown in the read circuit RO1 is a differential amplifier that reads the resistance value relationship between the MTJ element 10A and the MTJ element 10B, and outputs data. It is possible to design the circuit in which the currents are flowed to both the MTJ element 10A and the MTJ element 10B in such directions that the read current flows downward, or electrons flow upward. In this case, a sense amplifier is provided in the read circuit RO2, and a driver is provided in the read circuit RO1 in FIG. 8.

As described above, the first embodiment can provide a magnetic memory that can prevent read disturb.

Second Embodiment

Figure 9B:
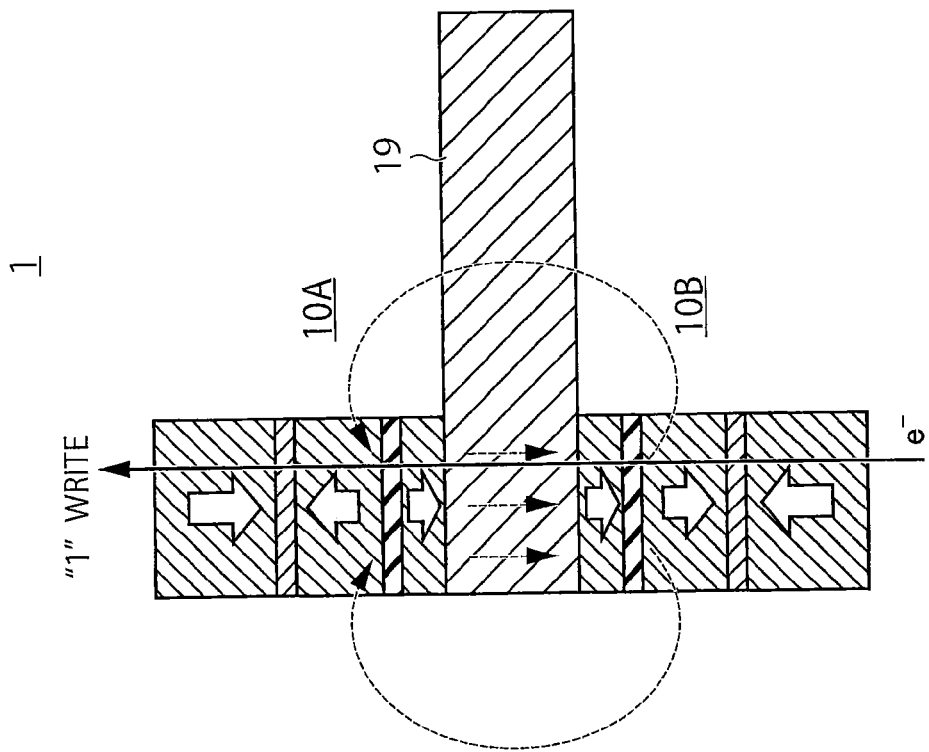
FIGS. 9A and 9B are diagrams for explaining a write method implemented in a magnetic memory according to a second embodiment.
Figure 9A:
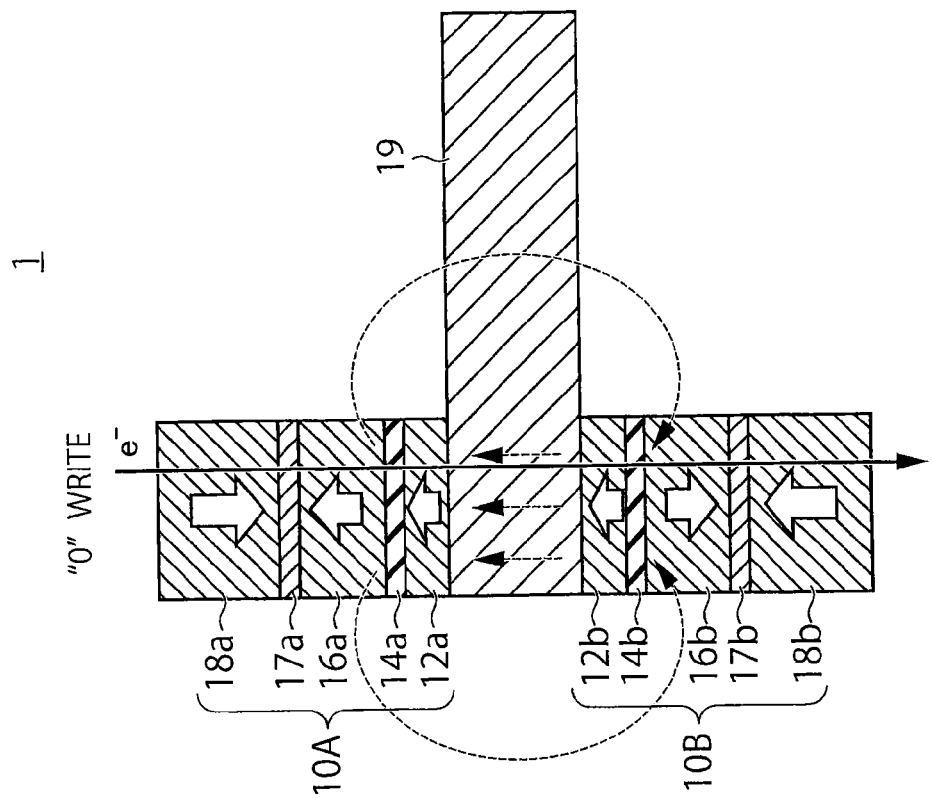

Referring to FIGS. 9A through 12B, a magnetic memory according to a second embodiment is described. FIGS. 9A and 9B are diagrams for explaining writing in a memory cell 1 according to the second embodiment. This magnetic memory of the second embodiment is the same as the magnetic memory of the first embodiment, except that the two MTJ elements 10A and 10B forming a memory cell are stacked in the vertical direction or in the stacking direction of the respective layers of the MTJ elements. As shown in FIGS. 9A and 9B, in the memory cell 1, the MTJ element 10A and the MTJ element 10B are stacked in the vertical direction, with an intermediate electrode 19 therebetween. The order in which the storage layer 12a, the tunnel barrier layer 14a, the reference layer 16a, the nonmagnetic layer 17a, and the shifting magnetic-field adjustment layer 18a of the MTJ element 10A are stacked is the reverse of the order in which the storage layer 12b, the tunnel barrier layer 14b, the reference layer 16b, the nonmagnetic layer 17b, and the shifting magnetic-field adjustment layer 18b of the MTJ element 10B are stacked. The storage layer 12a and the storage layer 12b are arranged to face each other, with the intermediate electrode 19 therebetween.

The magnetization directions of the storage layers 12a and 12b of the MTJ element 10A and the MTJ element 10B are the same, and magnetic fields generated from the storage layers 12a and 12b act on each other. The intensity of the interactive magnetic fields is 1/10 of the coercive force or more. The magnetization directions of the reference layers 16a and 16b of the MTJ element 10A and the MTJ element 10B are antiparallel to each other. Therefore, when one of the MTJ elements is in a high-resistance state, the other MTJ element is in a low-resistance state.

The magnetic field that acts on the storage layer of one of the MTJ element 10A and the MTJ element 10B, or on the storage layer 12a of the MTJ element 10A, for example, is designed to cancel not only the magnetic fields generated from the reference layer 16a and the shifting magnetic-field adjustment layer 18a of the MTJ element 10A, but also the combination of the magnetic fields generated from the reference layer 16b and the shifting magnetic-field adjustment layer 18b of the other MTJ element 10B of the pair.

In the second embodiment, the intermediate electrode 19 is interposed between the MTJ element 10A and the MTJ element 10B, so that a current can be flowed to the MTJ element 10A and the MTJ element 10B through the intermediate electrode 19. In FIG. 9A, the MTJ element 10A is in a low-resistance state, as the magnetization directions of the storage layer 12a and the reference layer 16a are parallel. The MTJ element 10B is in a high-resistance state, as the magnetization directions of the storage layer 12b and the reference layer 16b are antiparallel. In the second embodiment, this state is defined as the "0" state of the memory. In FIG. 9B, on the other hand, the MTJ element 10A is in a high-resistance state, and the MTJ element 10B is in a low-resistance state. This state is defined as the "1" state. Those states can be reversed.

Of the two MTJ elements 10A and 10B forming the pair, the MTJ element 10A has a lower storage layer structure in which the storage layer 12a is located below the reference layer 16a, and the MTJ element 10B has an upper storage layer structure in which the storage layer 12b is located above the reference layer 16b. In this arrangement, the distance between the storage layers 12a and 12b of the pair of MTJ elements 10A and 10B is shorter. Accordingly, stronger interactive magnetic fields can be obtained.

In FIGS. 9A and 9B, the solid-line arrows indicate the electron pathways formed at the time of writing. When writing is performed, a current that is to flow through the two MTJ elements 10A and 10B is flowed. The polarity of the current to be flowed to write the information "0" is the opposite of the polarity of the current to be flowed to write the information "1". As shown in FIG. 9A, to write the information "0", the current is flowed in such a direction that electrons flow from the MTJ element 10A toward the MTJ element 10B. As shown in FIG. 9B, to write the information "1", the current is flowed in such a direction that electrons flow from the MTJ element 10B toward the MTJ element 10A. This current is affected by spin torques that switch the magnetization directions of both of the storage layers 12a and 12b of the MTJ element 10A and the MTJ element 10B. As the magnetization directions of the storage layers 12a and 12b of the two MTJ elements 10A and 10B are simultaneously switched, the adverse influence of the interactive magnetic fields hindering magnetization reversals becomes reasonably smaller, and increases in inversion current can be restrained.

Figure 10B:
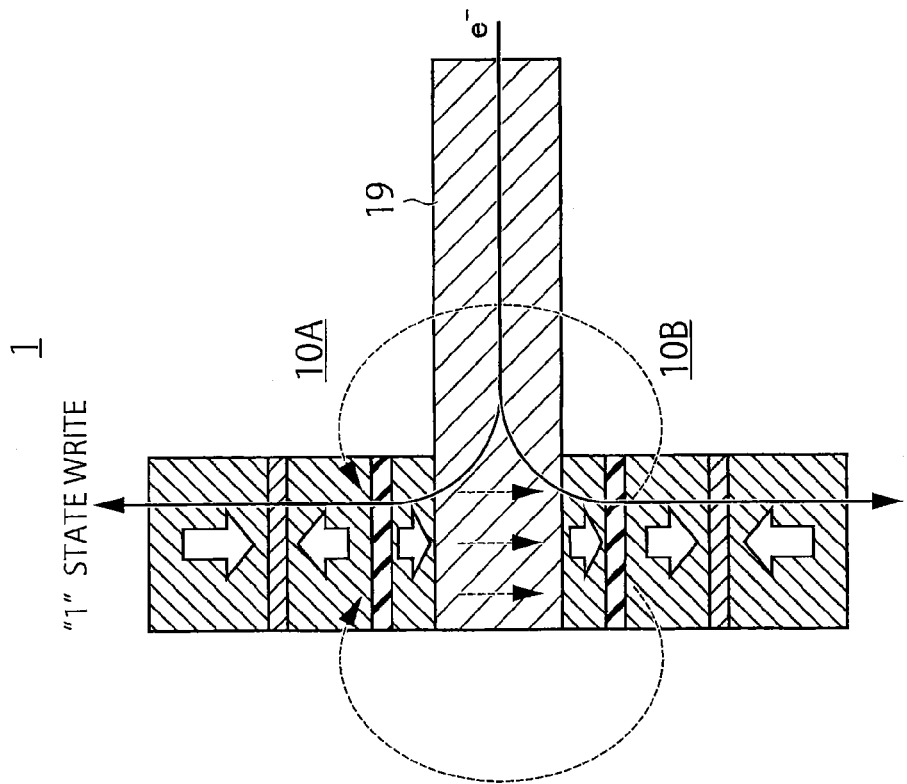
FIGS. 10A and 10B are diagrams for explaining a read method implemented in the magnetic memory according to the second embodiment.
Figure 10A:
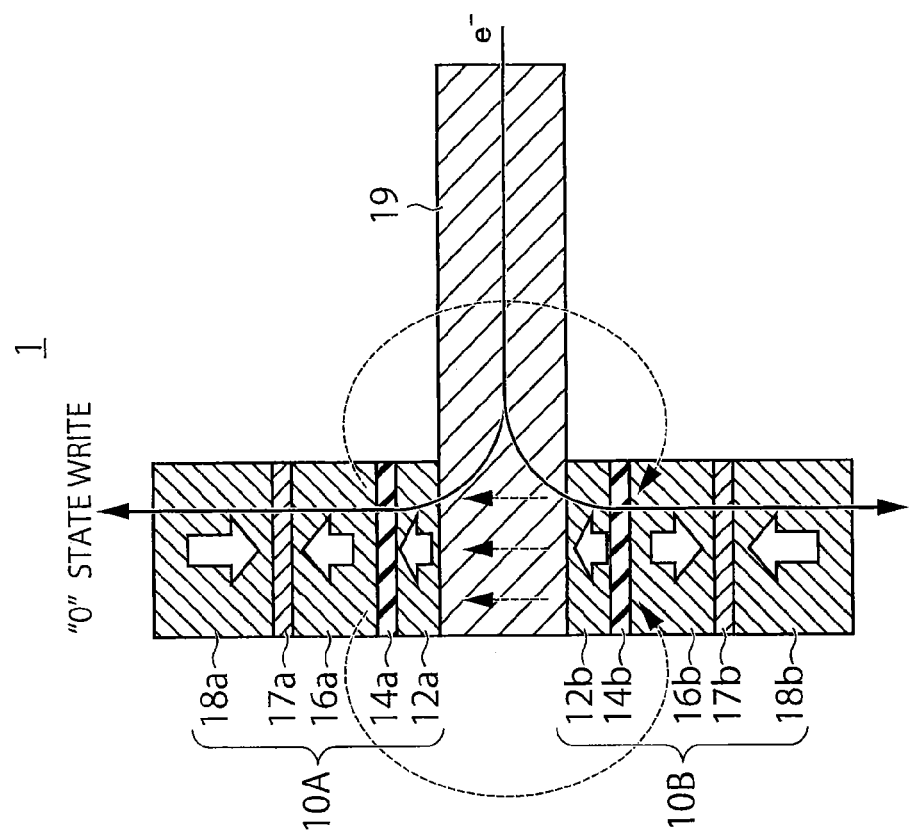

In the magnetic memory of the second embodiment, when information is read from a memory cell, the current is flowed in parallel to the MTJ element 10A and the MTJ element 10B through the intermediate electrode 19, as shown in FIGS. 10A and 10B. FIGS. 10A and 10B show examples in which the current is flowed in such a direction that electrons flow from the intermediate electrode 19 into the MTJ element 10A and the MTJ element 10B. In FIGS. 10A and 10B, the solid-line arrows indicate directions in which electrons flow. However, the direction of flowing current can be the opposite of that in the cases illustrated in FIGS. 10A and 10B.

By flowing the current in the above manner, spin torques are applied in such directions that both of the MTJ element 10A and the MTJ element 10B are put into a parallel state. Specifically, while the read current is being flowed, a spin torque in the direction in which a spin torque transfer switching occurs in opposite direction is applied only to one of the MTJ element 10A and the MTJ element 10B. A spin torque in the spin torque transfer switching direction is applied to the MTJ element 10A in the case of FIG. 10A, and to the MTJ element 10B in the case of FIG. 10B. In either case, however, the magnetization direction is stabilized by the magnetic field straying from the other MTJ element. Accordingly, there is a lower probability that a spin torque transfer switching will actually occur and result in read disturb.

(Write and Read Operations)

Figure 11:
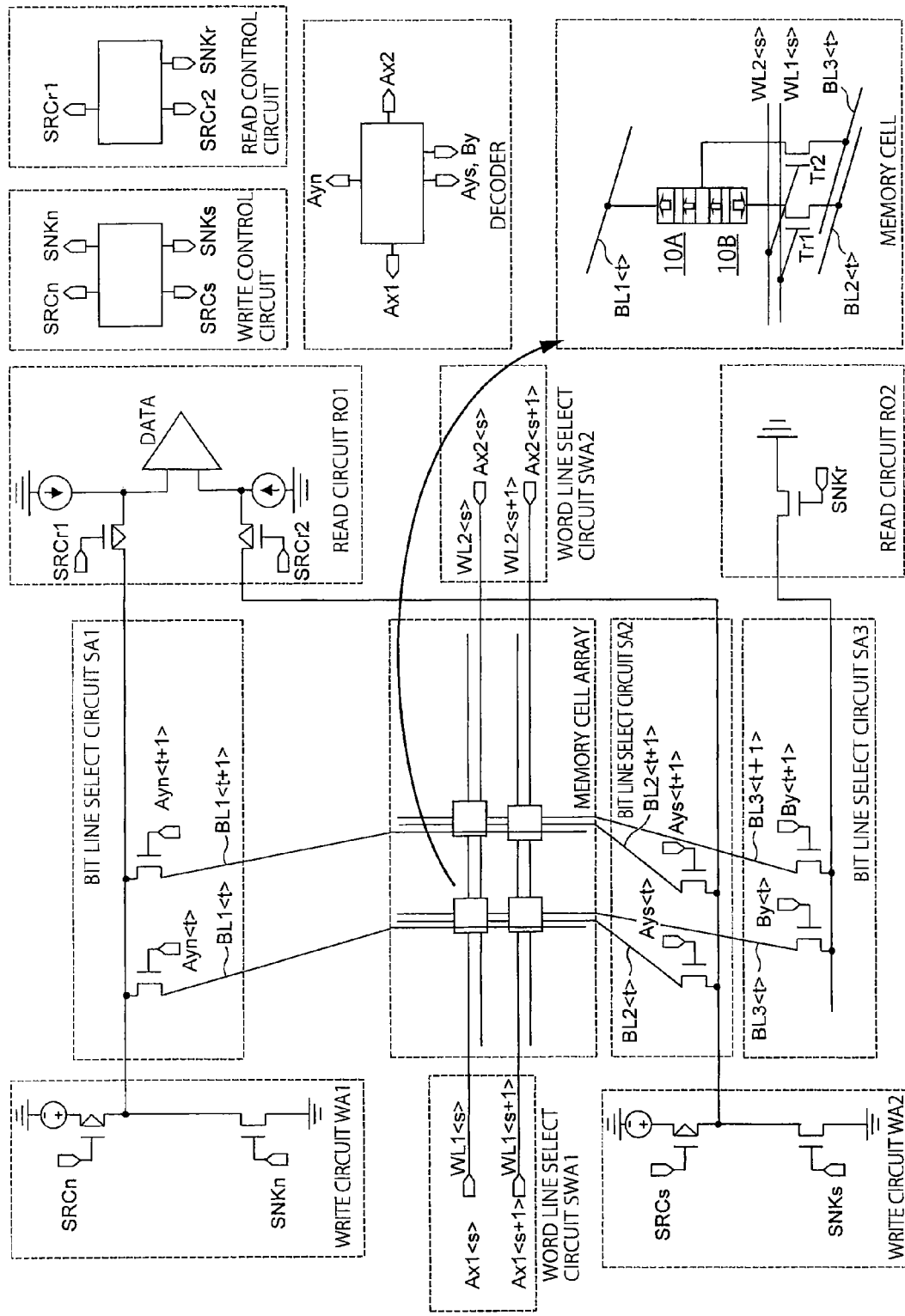
FIG. 11 is a block diagram showing the write and read circuit of the magnetic memory according to the second embodiment.

FIG. 11 shows an example of a circuit to realize write and read operations in the magnetic memory of the second embodiment. This circuit includes a memory cell array, a bit line select circuit SA1, a bit line select circuit SA2, a bit line select circuit SA3, a word line select circuit SWA1, and a word line select circuit SWA2. The circuit further includes a write circuit WA1, a write circuit WA2, a read circuit RO1, and a read circuit RO2. The circuit further includes control circuits, which are a write control circuit, a read control circuit, and a decoder.

In the memory cell array, memory cells equivalent to the four bits of a 2×2 region in the entire array are shown. In each memory cell, the two MTJ elements 10A and 10B forming a pair are arranged in the vertical direction. In the memory cell located in a row s and a column t, a bit line BL1<t> is connected to the upper electrode of the MTJ element 10A. A select transistor Tr1 is connected to the lower electrode of the MTJ element 10B. A select transistor Tr2 is connected to the intermediate electrode 19 interposed between the MTJ element 10A and the MTJ element 10B. A word line WL1<s> and a word line WL2<s> are connected to the gates of the select transistors Tr1 and Tr2, respectively. Further, a bit line BL2<t> is connected to the electrode on the opposite side of the select transistor Tr1 from the MTJ element 10B, and a bit line BL3<t> is connected to the electrode on the opposite side of the select transistor Tr2 from the intermediate electrode 19 interposed between the MTJ element 10A and the MTJ element 10B.

The bit line BL1<t> is connected to the write circuit WA1 and the read circuit RO1 via the bit line select circuit SA1. The bit line BL2<t> is connected to the write circuit WA2 via the bit line select circuit SA2. Further, the bit line BL3<t> is connected to the read circuit RO2 via the bit line select circuit SA3. The word line WL1<s> is connected to the word line select circuit SWA1, and the word line WL2<s> is connected to the word line select circuit SWA2.

The read circuit RO1 includes a differential amplifier circuit, to detect the resistance difference between the MTJ element 10A and the MTJ element 10B of a selected memory cell, and output the data indicating the "0" state or the "1" state. In the read current path, the select transistor Tr1 is connected to the side of the MTJ element 10B. However, no transistors are connected to the side of the MTJ element 10A. Therefore, the parasitic resistance value of the current path minus the resistance of the MTJ elements is unbalanced. In view of this, a resistance for correcting the unbalanced resistance can be inserted into the current path that is located in the read circuit RO1 and is connected to the MTJ element 10A.

Figures 12A, 12B:
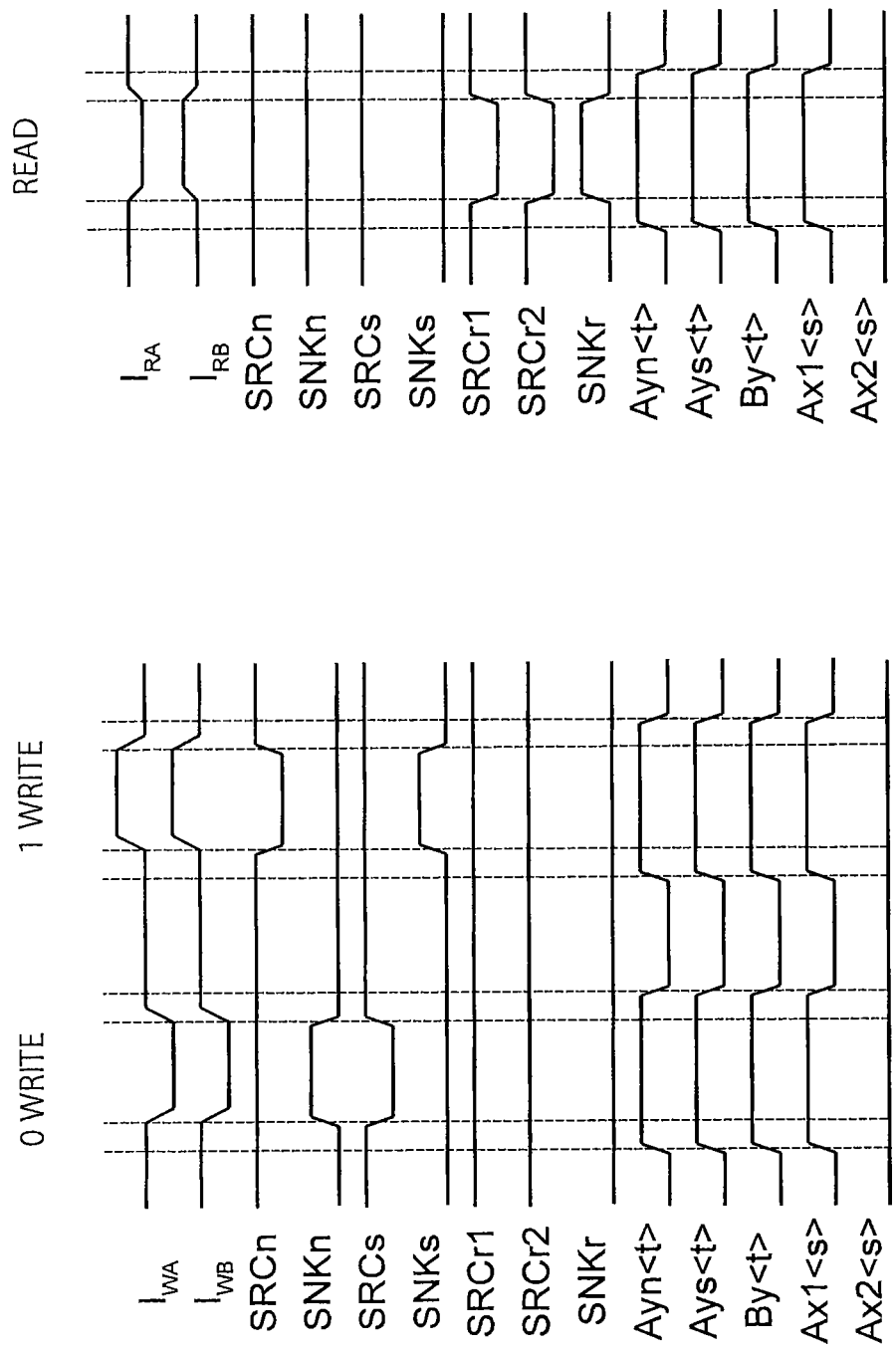
FIGS. 12A and 12B show timing charts for writing and reading in the magnetic memory according to the second embodiment.

FIGS. 12A and 12B show examples of timing charts for operating the magnetic memory of the second embodiment. FIG. 12A shows write timing charts to realize writing in the MTJ element 10A and the MTJ element 10B through the current path shown in FIG. 11. FIG. 12B shows read timing charts to realize reading through the current path shown in FIG. 11.

At the time of writing, a current that is to flow through the MTJ element 10A and the MTJ element 10B is flowed while the select transistor Tr2 connected to the intermediate electrode 19 interposed between the MTJ element 10A and the MTJ element 10B is in an off state, as shown in FIG. 12A. For example, to write the information "0", the memory cell that is located in the row s and the column t and is subjected to the writing is selected by turning on bit line select transistors Ayn<t> and Ays<t> of the MTJ element 10A and the MTJ element 10B and the select transistor Tr1, and turning off the select transistor Tr2 in the memory cell. After that, transistors SNKAn and SRCAs of the write circuits WA1 and WA2 are turned on, to flow the current to the MTJ elements 10A and 10B in the direction from the source of the write circuit WA2 toward the sink of the write circuit WA1.

To write the information "1", after the sell selection, transistors SRCAn and SNKAs of the write circuits WA1 and WA2 are turned on, to flow the current to the MTJ element 10A and the MTJ element 10B in the direction from the source of the write circuit WA1 toward the sink of the write circuit WA2. The voltages to be applied to the gate terminals of the transistors SRCAn, SRCAs, SNKAn, and SNKAs are generated from the write control circuit. The voltages to be applied to the gate terminals of the bit line select transistors Ayn<t>, Ays<t>, and By<t>, and a word line select transistor Ax1<s> are generated from the decoder.

In the reading illustrated in FIG. 12B, on the other hand, the memory cell that is located in the row s and column t and is subjected to the reading is selected by turning on the bit line select transistors Ayn<t> and Ays<t> of the MTJ element 10A and the MTJ element 10B, and the select transistors Tr1 and Tr2 in the memory cell. After the memory cell is selected, transistors SRCr1, SRCr2, and SNKr of the read circuits RO1 and RO2 are turned on, to flow the read current in parallel to the MTJ element 10A and the MTJ element 10B through the intermediate electrode 19. The voltages to be applied to the gate terminals of the transistors SRCr1, SRCr2, and SNKr are generated from the read control circuit.

As described above, the second embodiment can provide a magnetic memory that can prevent read disturb.

Third Embodiment

Figure 13B:
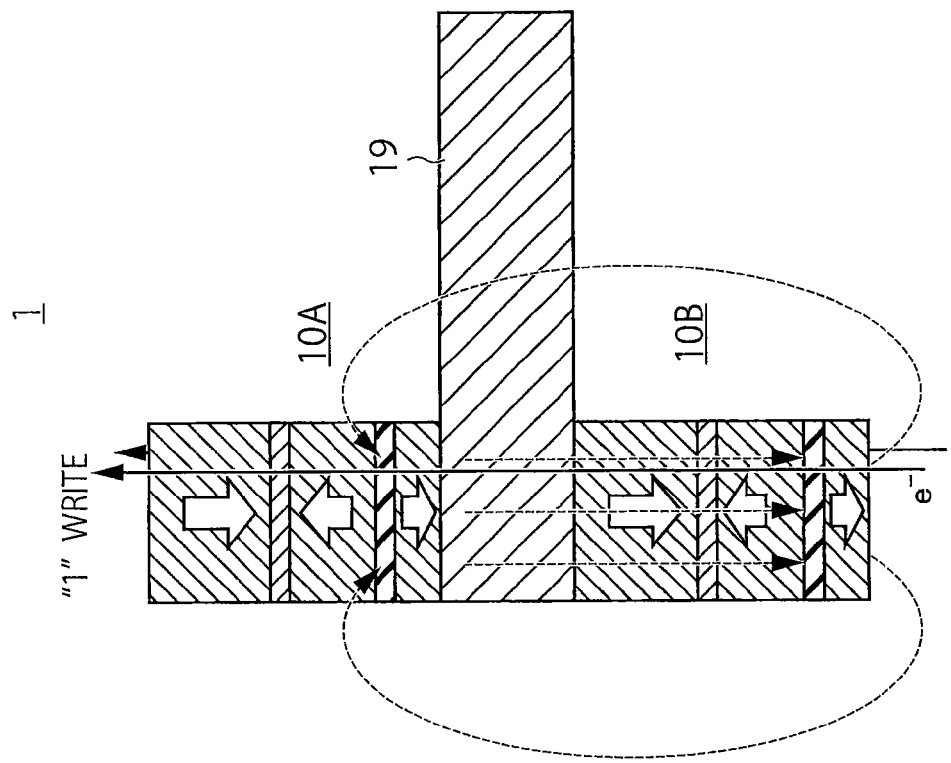
FIGS. 13A and 13B are diagrams for explaining a write method implemented in a magnetic memory according to a third embodiment.
Figure 13A:
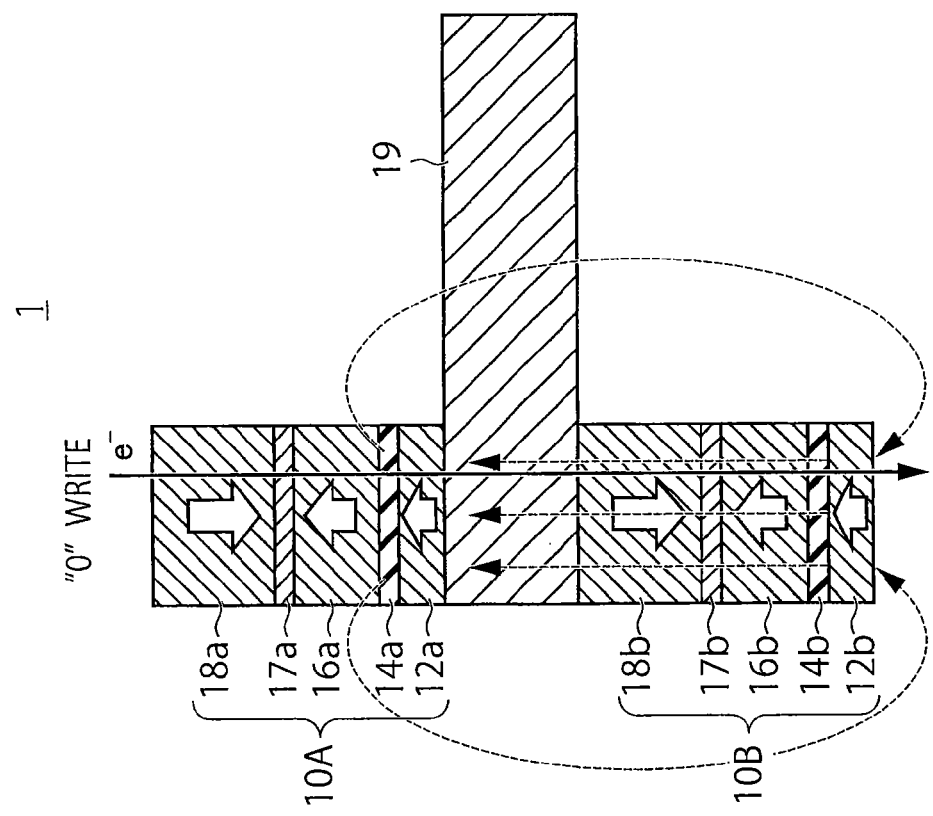

Referring to FIGS. 13A through 14B, a magnetic memory according to a third embodiment is described. FIGS. 13A and 13B are diagrams for explaining writing in a memory cell 1 according to the third embodiment. The magnetic memory of the third embodiment is the same as the magnetic memory of the first embodiment, except that the two MTJ elements 10A and 10B forming a memory cell are stacked in the vertical direction or in the stacking direction of the respective layers of the MTJ elements. As shown in FIGS. 13A and 13B, in the memory cell 1, the MTJ element 10A and the MTJ element 10B are stacked in the vertical direction, with an intermediate electrode 19 therebetween. The order in which the storage layer 12a, the tunnel barrier layer 14a, the reference layer 16a, the nonmagnetic layer 17a, and the shifting magnetic-field adjustment layer 18a of the MTJ element 10A are stacked is the same as the order in which the storage layer 12b, the tunnel barrier layer 14b, the reference layer 16b, the nonmagnetic layer 17b, and the shifting magnetic-field adjustment layer 18b of the MTJ element 10B are stacked. The storage layer 12a of the MTJ element 10A and the shifting magnetic-field adjustment layer 18b of the MTJ element 10B are arranged to face each other, with the intermediate electrode 19 therebetween.

In the MTJ element 10A and the MTJ element 10B of the third embodiment, the storage layer 12a and the storage layer 12b are located below the respective reference layers 16a and 16b, and the magnetization directions of the reference layers 16a and 16b of the MTJ element 10A and the MTJ element 10B are the same. The magnetic fields straying from the storage layers 12a and 12b of the two MTJ elements 10A and 10B act on each other side.

In both of the MTJ element 10A and the MTJ element 10B, a low-resistance state is defined as the "0" state as shown in FIG. 13A, and a high-resistance state is defined as the "1" state, as shown in FIG. 13B. To write the information "0", a current is flowed in such a direction that electrons flow downward as shown in FIG. 13A. To write the information "1", the current is flowed in such a direction that electrons flow upward as shown in FIG. 13B. In this manner, the magnetization directions of the storage layers 12a and 12b in the two MTJ elements 10A and 10B are simultaneously switched.

Figure 14B:
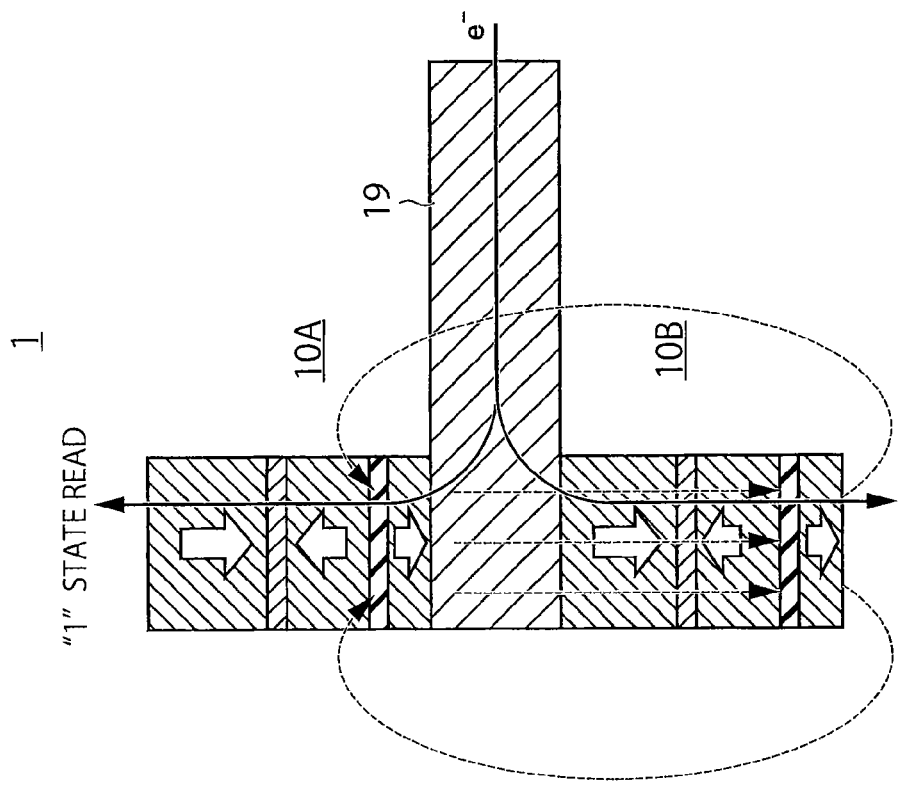
FIGS. 14A and 14B are diagrams for explaining a read method implemented in the magnetic memory according to the third embodiment.
Figure 14A:
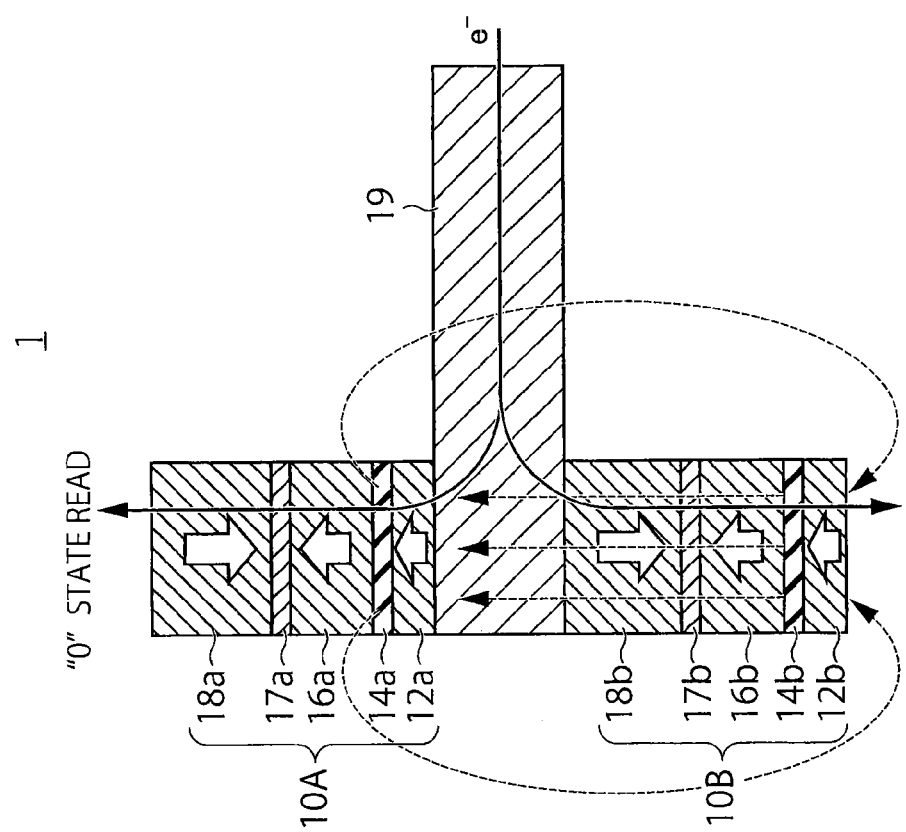

To perform reading, on the other hand, the current is flowed in parallel to the MTJ element 10A and the MTJ element 10B through the intermediate electrode 19, as shown in FIGS. 14A and 14B. At the time of reading, a spin torque might be applied in such a direction as to switch the magnetization of the storage layers by the read current. However, the probability of read disturb due to a magnetization reversal is reduced to a small value by the magnetic fields straying from the storage layers 12a and 12b of the pair of MTJ elements 10A and 10B. The reading performed in this cell structure is not differential reading, but is sense amplifier reading, which uses the same reference potential as that in reading from a single MTJ element in a conventional magnetic memory.

The cell structure of the third embodiment illustrated in FIGS. 13A through 14B is a structure in which the two MTJ elements 10A and 10B forming a pair have the respective storage layers located at the bottoms, and substantially the same film forming process can be used for both of the MTJ elements 10A and 10B. Accordingly, the third embodiment is more advantageous than the second embodiment, in terms of the process. However, the third embodiment has disadvantages in being incapable of performing differential reading and having weaker interactive magnetic fields.

Figure 15:
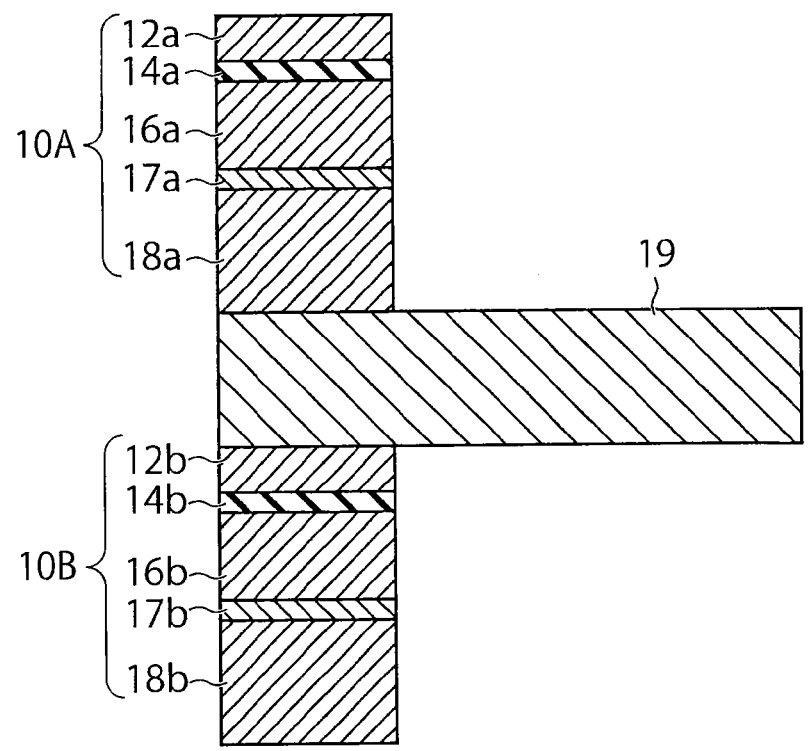
FIG. 15 is a diagram showing a magnetic memory according to a modification of the third embodiment.

As a modification of the third embodiment, a structure in which the storage layers 12a and 12b are located above the reference layers 16a and 16b in the MTJ elements 10A and MTJ element 10B can be formed, as illustrated in FIG. 15. That is, the shifting magnetic-field adjustment layer 18b, the nonmagnetic layer 17b, the reference layer 16b, the tunnel barrier layer 14b, the storage layer 12b, the intermediate electrode 19, the shifting magnetic-field adjustment layer 18a, the nonmagnetic layer 17a, the reference layer 16a, the tunnel barrier layer 14a, and the storage layer 12a can be stacked in this order.

At the time of reading, the reading can be performed by flowing a current to one of the MTJ elements 10A and 10B.

As described above, the third embodiment can provide a magnetic memory that can prevent read disturb.

Figure 16:
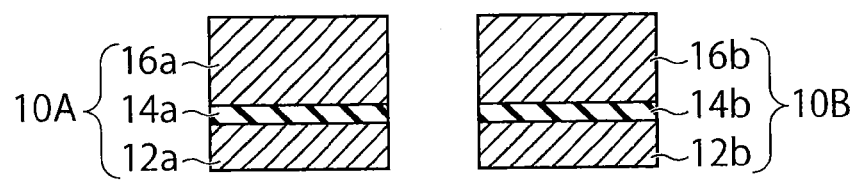
FIG. 16 is a diagram showing a magnetic memory according to a modification of the first embodiment.

In the above described first through third embodiments, the MTJ elements 10A and 10B in each memory cell include the shifting magnetic-field adjustment layers 18a and 18b, respectively, but the shifting magnetic-field adjustment layers 18a and 18b can be omitted. For example, in the memory cell of the first embodiment illustrated in FIGS. 1A and 1B, the MTJ element 10A can be formed with the storage layer 12a, the tunnel barrier layer 14a, and the reference layer 16a, and the MTJ element 10B can be formed with the storage layer 12b, the tunnel barrier layer 14b, and the reference layer 16b, as shown in FIG. 16. The same applies to the second and third embodiments.

While certain embodiments have been described, these embodiments have been presented by way of example only, and are not intended to limit the scope of the invention. Indeed, the novel methods and systems described herein can be embodied in a variety of other forms; furthermore, various omissions, substitutions and changes in the form of the methods and systems described herein can be made without departing from the spirit of the invention. The accompanying claims and their equivalents are intended to cover such forms or modifications as would fall within the scope and spirit of the invention.

What is claimed is:

1. A magnetic memory comprising a memory cell, the memory cell comprising:
   a first magnetic tunnel junction (MTJ) element including a first storage layer including a first magnetic film having a changeable magnetization direction, a first reference layer including a second magnetic film having a fixed magnetization direction, and a first tunnel barrier layer provided between the first storage layer and the first reference layer, the first storage layer being above the first reference layer;
   a second MTJ element including a second storage layer including a third magnetic film having a changeable magnetization direction antiparallel to the magnetization direction of the first storage layer, a second reference layer including a fourth magnetic film having a fixed magnetization direction parallel to the magnetization direction of the first reference layer, and a second tunnel barrier layer provided between the second storage layer and the second reference layer, the second storage layer being above the second reference layer, the first MTJ element and the second MTJ element being arranged in a direction crossing a stacking direction of the first MTJ element; and
   a write circuit and a read circuit, the write circuit being configured to perform a writing in which a direction of a first write current flowing between the first storage layer and the first reference layer of the first MTJ element via the first tunnel barrier layer is opposite to a direction of a second write current flowing between the second storage layer and the second reference layer of the second MTJ element via the second tunnel barrier layer, and
   the read circuit being configured to perform a reading in which a direction of a first read current flowing between the first storage layer and the first reference layer of the first MTJ element via the first tunnel barrier layer is the same as a direction of a second read current flowing between the second storage layer and the second reference layer of the second MTJ element via the second tunnel barrier layer.

2. A magnetic memory comprising a memory cell, the memory cell comprising:
   a first magnetic tunnel junction (MTJ) element including a first storage layer including a first magnetic film having a changeable magnetization direction, a first reference layer including a second magnetic film having a fixed magnetization direction, and a first tunnel barrier layer provided between the first storage layer and the first reference layer, the first reference layer being above the first storage layer;
   a second MTJ element including a second storage layer including a third magnetic film having a changeable magnetization direction antiparallel to the magnetization direction of the first storage layer, a second reference layer including a fourth magnetic film having a fixed magnetization direction parallel to the magnetization direction of the first reference layer, and a second tunnel barrier layer provided between the second storage layer and the second reference layer, the second reference layer being above the second storage layer, the first MTJ element and the second MTJ element being arranged in a direction crossing a stacking direction of the first MTJ element; and
   a write circuit and a read circuit, the write circuit being configured to perform a writing in which a direction of a first write current flowing between the first storage layer and the first reference layer of the first MTJ element via the first tunnel barrier layer is opposite to a direction of a second write current flowing between the second storage layer and the second reference layer of the second MTJ element via the second tunnel barrier layer, and
   the read circuit being configured to perform a reading in which a direction of a first read current flowing between the first storage layer and the first reference layer of the first MTJ element via the first tunnel barrier layer is the same as a direction of a second read current flowing between the second storage layer and the second reference layer of the second MTJ element via the second tunnel barrier layer.

3. The memory according to claim 2, wherein the read circuit comprises an amplifier configured to amplify a difference between a first voltage drop that occurs in the first MTJ element when the first read current is flowed to the first MTJ element and a second voltage drop that occurs in the second MTJ element when the second read current is flowed to the second MTJ element, and the read circuit reads information stored in the memory cell based on the difference amplified by the amplifier.

4. The memory according to claim 1, wherein, each of the first and second MTJ elements has an external planar size so that a maximum length in a direction perpendicular to a straight line connecting respective gravity centers of the first and second MTJ elements is greater than a maximum width in a direction parallel to the straight line.

5. A magnetic memory comprising a memory cell, the memory cell comprising:
   a first magnetic tunnel junction (MTJ) element including a first storage layer including a first magnetic film having a changeable magnetization direction, a first reference layer including a second magnetic film having a fixed magnetization direction, and a first tunnel barrier layer provided between the first storage layer and the first reference layer; and
   a second MTJ element including a second storage layer including a third magnetic film having a changeable magnetization direction antiparallel to the magnetization direction of the first storage layer, a second reference layer including a fourth magnetic film having a fixed magnetization direction parallel to the magnetization direction of the first reference layer, and a second tunnel barrier layer provided between the second storage layer and the second reference layer, the first MTJ element and the second MTJ element being arranged in a direction crossing a stacking direction of the first MTJ element,
   wherein a planar shape of the first storage layer of the first MTJ element has a first side and a second side facing the first side, and a planar shape of the second storage layer of the second MTJ element has a third side facing the first side, and a fourth side facing the third side,
   wherein a curvature radius of the first side of the first storage layer is larger than a curvature radius of the second side, and
   wherein a curvature radius of the third side of the second storage layer is larger than a curvature radius of the fourth side.

6. A magnetic memory comprising a memory cell, the memory cell comprising:
   a first magnetic tunnel junction (MTJ) element including a first storage layer including a first magnetic film having a changeable magnetization direction, a first reference layer including a second magnetic film having a fixed magnetization direction, and a first tunnel barrier layer provided between the first storage layer and the first reference layer; and a second MTJ element including a second storage layer including a third magnetic film having a changeable magnetization direction antiparallel to the magnetization direction of the first storage layer, a second reference layer including a fourth magnetic film having a fixed magnetization direction parallel to the magnetization direction of the first reference layer, and a second tunnel barrier layer provided between the second storage layer and the second reference layer, the first MTJ element and the second MTJ element being arranged in a direction crossing a stacking direction of the first MTJ element, wherein the first MTJ element further includes a first magnetic layer provided on the opposite side of the first reference layer from the first tunnel barrier layer and having a magnetization direction antiparallel to the magnetization direction of the first reference layer, and a first nonmagnetic layer provided between the first reference layer and the first magnetic layer, and wherein the second MTJ element further includes a second magnetic layer provided on the opposite side of the second reference layer from the second tunnel barrier layer and having a magnetization direction antiparallel to the magnetization direction of the second reference layer, and a second nonmagnetic layer provided between the second reference layer and the second magnetic layer.

7. The memory according to claim 1, wherein each of the first storage layer, the second storage layer, the first reference layer, and the second reference layer has a magnetization direction parallel to a stacking direction of each of the first and second MTJ elements.

8. The memory according to claim 1, wherein the second storage layer is magnetically connected to the first storage layer.

9. The memory according to claim 2, wherein the second storage layer is magnetically connected to the first storage layer.

10. The memory according to claim 2, wherein, each of the first and second MTJ elements has an external planar size so that a maximum length in a direction perpendicular to a straight line connecting respective gravity centers of the first and second MTJ elements is greater than a maximum width in a direction parallel to the straight line.

11. The memory according to claim 2, wherein
a planar shape of the first storage layer of the first MTJ element has a first side and a second side facing the first side, and a planar shape of the second storage layer of the second MTJ element has a third side facing the first side, and a fourth side facing the third side,
a curvature radius of the first side of the first storage layer is larger than a curvature radius of the second side, and
a curvature radius of the third side of the second storage layer is larger than a curvature radius of the fourth side.

12. The memory according to claim 2, wherein
the first MTJ element further includes a first magnetic layer provided on the opposite side of the first reference layer from the first tunnel barrier layer and having a magnetization direction antiparallel to the magnetization direction of the first reference layer, and a first nonmagnetic layer provided between the first reference layer and the first magnetic layer, and
the second MTJ element further includes a second magnetic layer provided on the opposite side of the second reference layer from the second tunnel barrier layer and having a magnetization direction antiparallel to the magnetization direction of the second reference layer, and a second nonmagnetic layer provided between the second reference layer and the second magnetic layer.

13. The memory according to claim 2, wherein each of the first storage layer, the second storage layer, the first reference layer, and the second reference layer has a magnetization direction parallel to a stacking direction of each of the first and second MTJ elements.

14. The memory according to claim 5, wherein, each of the first and second MTJ elements has an external planar size so that a maximum length in a direction perpendicular to a straight line connecting respective gravity centers of the first and second MTJ elements is greater than a maximum width in a direction parallel to the straight line.

15. The memory according to claim 5, wherein
the first MTJ element further includes a first magnetic layer provided on the opposite side of the first reference layer from the first tunnel barrier layer and having a magnetization direction antiparallel to the magnetization direction of the first reference layer, and a first nonmagnetic layer provided between the first reference layer and the first magnetic layer, and
the second MTJ element further includes a second magnetic layer provided on the opposite side of the second reference layer from the second tunnel barrier layer and having a magnetization direction antiparallel to the magnetization direction of the second reference layer, and a second nonmagnetic layer provided between the second reference layer and the second magnetic layer.

16. The memory according to claim 5, wherein each of the first storage layer, the second storage layer, the first reference layer, and the second reference layer has a magnetization direction parallel to a stacking direction of each of the first and second MTJ elements.

17. The memory according to claim 6, wherein each of the first storage layer, the second storage layer, the first reference layer, and the second reference layer has a magnetization direction parallel to a stacking direction of each of the first and second MTJ elements.

18. The memory according to claim 5, wherein the second storage layer is magnetically connected to the first storage layer.

19. The memory according to claim 6, wherein the second storage layer is magnetically connected to the first storage layer.

* * * * *